United States Patent
Sasajima et al.

(10) Patent No.: US 7,625,205 B2
(45) Date of Patent: Dec. 1, 2009

(54) HEAT TREATMENT APPARATUS AND METHOD OF MANUFACTURING SUBSTRATES

(75) Inventors: Ryota Sasajima, Toyama (JP); Iwao Nakamura, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 22 days.

(21) Appl. No.: 11/663,852

(22) PCT Filed: Sep. 29, 2005

(86) PCT No.: PCT/JP2005/017967

§ 371 (c)(1),
(2), (4) Date: Jun. 5, 2007

(87) PCT Pub. No.: WO2006/035879

PCT Pub. Date: Jun. 4, 2006

(65) Prior Publication Data

US 2007/0292814 A1 Dec. 20, 2007

(30) Foreign Application Priority Data

Sep. 30, 2004 (JP) .............................. 2004-287120
Sep. 30, 2004 (JP) .............................. 2004-287739
Aug. 10, 2005 (JP) .............................. 2005-232275

(51) Int. Cl.
*F27D 5/00* (2006.01)
(52) U.S. Cl. ...................................... 432/253; 432/258
(58) Field of Classification Search ................. 432/253, 432/258, 259; 211/41.18; 206/454; 414/935, 414/936, 937, 938, 939
See application file for complete search history.

(56) References Cited

U.S. PATENT DOCUMENTS

| | | | | |
|---|---|---|---|---|
| 4,725,474 A | * | 2/1988 | Stavric | 428/156 |
| 5,752,609 A | * | 5/1998 | Kato et al. | 211/41.18 |
| 6,293,749 B1 | * | 9/2001 | Raaijmakers et al. | 414/609 |
| 6,464,445 B2 | * | 10/2002 | Knapik et al. | 414/416.03 |
| 6,474,987 B1 | * | 11/2002 | Nakai et al. | 432/258 |
| 6,578,893 B2 | * | 6/2003 | Soucy et al. | 294/99.1 |
| 6,634,882 B2 | * | 10/2003 | Goodman | 432/253 |
| 6,709,267 B1 | * | 3/2004 | Hawkins et al. | 432/258 |
| 6,799,940 B2 | | 10/2004 | Joe et al. | |
| 6,840,767 B2 | * | 1/2005 | Goodman | 432/253 |

(Continued)

FOREIGN PATENT DOCUMENTS

| | | | |
|---|---|---|---|
| JP | A-2002-033284 | | 1/2002 |
| JP | A-2004-200678 | | 7/2004 |
| JP | 2006005274 A | * | 1/2006 |

(Continued)

*Primary Examiner*—Gregory A Wilson
(74) *Attorney, Agent, or Firm*—Oliff & Berridge, PLC

(57) ABSTRACT

A heat treatment device and a method of manufacturing substrates capable of reducing the slippage of the substrates when the substrates are supported on support parts comprising plate-like members. The device comprises a support device having the support parts in contact with the substrates and a body part supporting the support parts. Each of the support parts comprises the plate-like members supporting the substrate so as not to come into contact with the peripheral edge portion of the substrate, and a non-contact part communication with the outside without coming into contact with the substrate is formed in the substrate placing surface of the support part. The overall opening area of the portion of the non-contact part communicating with the outside is 25 to 94% of the overall area of the substrate placing surface.

8 Claims, 21 Drawing Sheets

U.S. PATENT DOCUMENTS

| | | | |
|---|---|---|---|
| 6,906,790 B2 * | 6/2005 | Kikuchi et al. | 355/75 |
| 7,163,393 B2 * | 1/2007 | Adachi | 432/253 |
| 7,210,925 B2 * | 5/2007 | Adachi | 432/253 |
| 7,329,947 B2 * | 2/2008 | Adachi et al. | 257/706 |
| 7,331,780 B2 * | 2/2008 | Adachi | 432/253 |
| 2001/0051088 A1 * | 12/2001 | Park et al. | 414/416.03 |
| 2005/0006916 A1 * | 1/2005 | Mantz | 294/103.1 |
| 2005/0100435 A1 * | 5/2005 | Dickinson | 414/941 |

FOREIGN PATENT DOCUMENTS

| | | |
|---|---|---|
| WO | WO 01/18856 A1 | 3/2001 |
| WO | WO 2004/030073 A1 | 4/2004 |

* cited by examiner

5mm : LIMIT OF PROCESSING THROUGH BY MACHINING PROCESS

3mm : LIMIT OF STRENGTH OF SUPPORTING MEMBER UNDER HEAT VARIATION

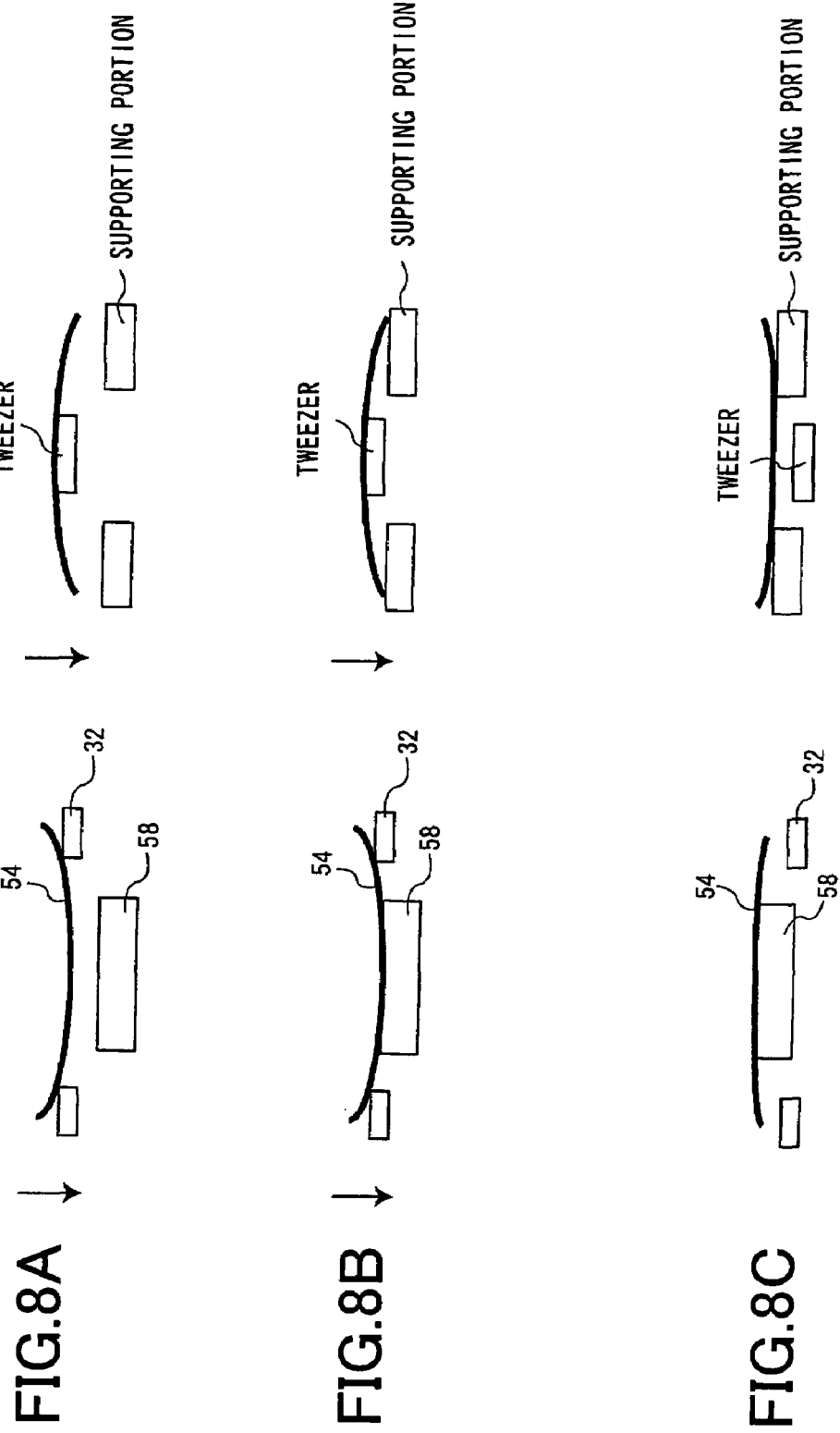

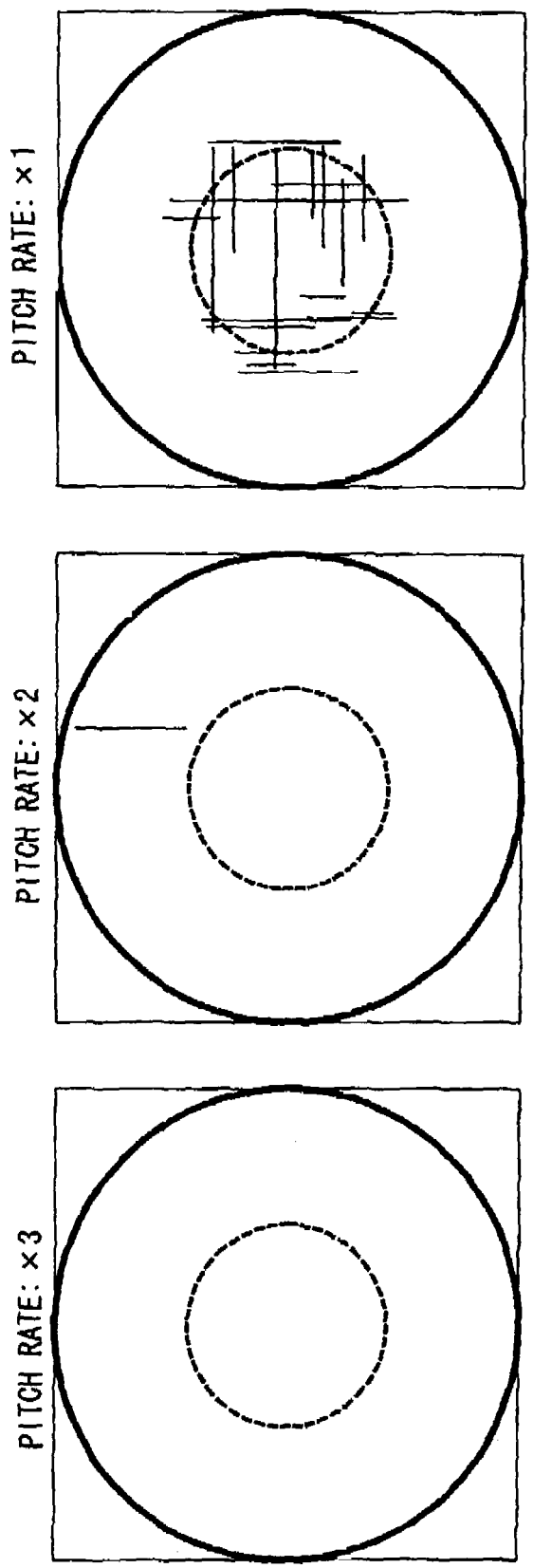

HEAT TREATMENT APPARATUS AND METHOD OF MANUFACTURING SUBSTRATES

TECHNICAL FIELD

The present invention relates to a heat treatment apparatus for applying a heat treatment to semiconductor wafers, glass substrates or the like, and a method of manufacturing substrates such as the semiconductor wafers or the glass substrates.

BACKGROUND ART

In the related art, a supporting tool in a vertically installed heat treatment apparatus includes a pair of upper and lower end plates, for example, three holding members disposed vertically between the both end plates so as to extend therebetween, and is configured to hold a number of holding grooves formed in the longitudinal direction at regular intervals on these three holding members so as to open toward each other, so that a plurality of substrates are arranged horizontally with the centers thereof aligned with each other by being inserted between the holding grooves of the three holding members. However, in the supporting tool in such configuration, the entire weight of each substrate is supported only by the holding grooves at three points, and hence there is a problem such that when a thermal stress is applied abruptly to the substrates, crystal defect (slippage) or warp of the substrates may arise due to a tensile stress between the contact surfaces between the substrates and the holding grooves or a self-weight stress.

As a method of solving this problem, an invention described in Patent Document 1 is exemplified. In this description, the supporting tool includes a body portion and supporting portions which are provided on the body portion and comes into contact with the substrates. The surface of the supporting portion is formed of a silicon plate member having a surface area smaller than that of a flat surface of the substrate, and a thickness larger than that of the substrate (hereinafter, referred to as a plate structure supporting tool), so that the entire weight of the substrate is dispersed to alleviate the tensile stress and the self-weight stress, so that occurrence of slippage is restrained.

Patent Document 1, Pamphlet of International Publication No. WO2004/030073

DISCLOSURE OF INVENTION

Problem to be Solved by the Invention

However, the aforementioned plate structure supporting tool demonstrates a sufficient effect in restraint of the slippage, but when an automatic transportation with a device robot (substrate transfer unit) is performed, a problem such that the treated substrate slips simultaneously when it is placed on the plate member, and deviated from a specified position (a position which enables automatic unloading of the treated substrate) occurs.

The cause of this phenomenon is that release of air existing between the treated substrate and the plate member is slow, and hence the air is compressed when the substrate is placed, so that a force of the compressed air pressing the treated substrate and the self-weight of the treated substrate are balanced.

When the present inventors performed an experiment, it was found that the effect of restraining the slippage of the aforementioned plate structure supporting tool is ensured when the distance between the wafers is relatively large (the pitch is large), but is reduced as the pitch is reduced.

FIG. 14 shows the result of this experiment. According to FIG. 14, the state of occurrence of slippage is deteriorated as the rate of the pitch is reduced.

It seems to be because the number of plates (supporting portions) which can be stored in each boat having the same length increases when the pitch is narrowed, thereby increasing the total heat capacity of the boats and the plates in a reactor.

That is, when the heat capacity increases, even through the temperature change in the reactor is at the same rate of temperature increase (decrease), followability of the boats and the plates by themselves with respect to the temperature change is deteriorated, which results in a phenomenon in which the temperature at contact portions between the wafers and the plates is close to the temperature of the plate, and the temperature at non-contact portions substantially follows the temperature change in the reactor.

Consequently, the temperature distribution within the plane of a treated wafer is as follows.

That is, the in-plane variation is small when the heat capacity of the plate is small, while the in-plane variation is large when the capacity of the plate is large.

The local temperature difference within the plane of the treated wafer applies a local heat stress within the plane, and consequently, the likelihood of occurrence of slippage increases.

The heat capacity means the amount of heat required for increasing the temperature of a substance by a unit temperature In the case of a uniform substance, the heat capacity is provided by a product of a specific heat (J/K·g) and a mass (g), so that the unit of the heat capacity in this case is (J/K).

When the pitch of the wafers in the boat for the plate structures is constant, and the number of plates in the reactor is identical, followability of the temperature of the boat and the plate with respect to the temperature control is improved by further reducing the heat capacity of the plate as long as there is no slippage in a certain heat treatment sequence.

Therefore, a state in which the slippage does not occur even when the temperature change rate is increased in the previous heat treatment sequences is achieved, so that the treatment time for one batch, that is, the throughput may be increased.

It is an object of the present invention to solve the above-described problem and provide a heat treatment apparatus and a method of manufacturing substrates in which prevention of slippage occurred when supporting substrates in a supporting portion formed of a plate member is ensured, and a slip-free state is achieved by reducing the heat capacity of the supporting portion, so that the throughput is improved.

Means for Solving the Problems

A first characteristic of the present invention is a heat treatment apparatus including a reaction container for treating a substrate and a supporting tool for supporting the substrate in the reaction container, wherein the supporting tool includes a supporting portion which comes into contact with the substrate and a body portion for supporting the supporting portion, the supporting portion is formed of a plate member for supporting the substrate so as not to come into contact with a peripheral portion of the substrate and includes at least one non-contact portion within a substrate placing plane so as to communicate with the outside without being contact with the substrate, and the surface area of the non-contact portion is set to a range between 25% and 94% inclusive of the surface area of an area surrounded by an outer edge line of the substrate placing plane of the plate member.

Preferably, the non-contact portion is provided at least at a center of the substrate placing plane. Further preferably, a substrate transfer unit for transferring the substrate to the supporting tool is provided, and the substrate transfer unit is adapted to support the peripheral portion of the substrate.

Preferably, the heat capacity of the plate member is set to the range between 61 J/K and 103 J/K inclusive. Preferably, the surface area of the non-contact portion is set to a range between 50% and 83% inclusive of the surface area of the area surrounded by the outer edge line of the substrate placing plane of the plate member. Preferably, the supporting portion is of a disc shape having a diameter which is set to a range between 63% and 70% inclusive of the diameter of the substrate. Preferably, the supporting portion is of a disc shape having a diameter from 190 to 210 mm, and the diameter of the substrate is 300 mm. Preferably, the supporting tool is adapted to support a plurality of the substrates in a plurality of stages substantially horizontally while leaving spaces therebetween. Preferably, the body portion is made of SiC, and the supporting portion is made of Si or SiC. Preferably, the supporting portion is formed with a layer of $SiO_2$, SiC, or $Si_3N_4$ on the surface thereof. Preferably, the heat treatment is a treatment performed at a temperature of 1300° C. or higher.

A second characteristic of the present invention is a heat treatment apparatus including a reaction container for treating a substrate, and a supporting tool for supporting the substrate in the reaction container, wherein the supporting tool includes a supporting portion that comes into contact with the substrate and a body portion for supporting the supporting portion, the supporting portion is formed of a plate member for supporting the substrate so as not to come into contact with a peripheral portion of the substrate and includes at least one non-contact portion within the substrate placing plane of the plate member so as to communicate with the outside without being contact with the substrate, and the heat capacity of the plate member is set to a range between 61 J/K and 103 J/K inclusive.

A third characteristic of the present invention is a method of manufacturing a substrate including the steps of transferring a substrate onto a supporting portion, the supporting portion being formed of a plate member for supporting the substrate so as not to come into contact with the peripheral portion of the substrate and including at least one non-contact portion within a substrate placing plane of the plate member so as to communicate with the outside without being contact with the substrate, the surface area of the non-contact portion is set to a range between 25% and 94% inclusive of the surface area of an area surrounded by an outer edge line of the substrate placing plane of the plate member, loading the substrate supported by the supporting portion into a reaction container, and unloading the substrate after heat treatment supported by the supporting portion from the reaction container.

A fourth characteristic of the present invention is a method of manufacturing substrates including the steps of supporting the substrate by a supporting portion, the supporting portion being formed of a plate member for supporting the substrate so as not to come into contact with the peripheral portion of the substrate and including at least one non-contact portion within a substrate placing plane of the plate member so as to communicate with the outside without being contact with the substrate, and a heat capacity of the supporting portion is set to a range between 61 J/K and 103 J/K inclusive, heat-treating the substrate supported by the supporting portion in the reaction container, and unloading the substrate after the heat treatment supported by the supporting portion from the reaction container.

A fifth characteristic of the present invention is a heat treatment apparatus including a reactor for treating a substrate and a supporting tool for supporting the substrate in the reactor, wherein the supporting tool includes a supporting portion which comes into contact with the substrates and a body portion for supporting the supporting portion, the supporting portion is formed of a plate member for supporting the substrate so as not to come into contact with a peripheral portion of the substrate and includes at least one non-contact portion within a substrate placing plane of the plate member so as to communicate with the outside without being contact with the substrate, and the gross opening area of a portion of the non-contact portion which communicates with the outside is included in a range between 25% and 94% inclusive of the gross area of the substrate placing plane.

Preferably, the non-contact portion is formed of at least one of a through hole and a groove. Preferably, the non-contact portion is provided at least at the center of the substrate placing plane. Further preferably, the non-contact portion is provided concentrically with the substrate at the center of the substrate placing surface. The non-contact portion may be provided at least one, and a plurality of the non-contact portions may also be provided. When providing only one non-contact portion, it is preferable to provide the same at the center of the substrate placing plane. Preferably, the gross area of the substrate placing plane of the supporting portion is included in a range between 10% and 70% inclusive of the flat surface of the substrate. Preferably, the supporting portion has a disc shape having a diameter between ⅓ and ⅚ inclusive of the outer diameter of the substrate. Preferably, the supporting portion has a disc shape, and has a diameter in a range between 100 mm and 250 mm inclusive. Preferably, the supporting portion is adapted to support the plurality of substrates in a plurality of stages substantially horizontally while leaving spaces therebetween. Preferably, the heat treatment apparatus includes a substrate transfer unit for transferring the substrate to the supporting tool, and the substrate transfer unit is adapted to support the peripheral portion of the substrate. Further preferably, the substrate transfer unit has a tweezer having a U-shape for supporting the peripheral portion of the substrate. Preferably, the substrate transfer unit is adapted to place the substrate on the supporting portion by inserting the substrate above the supporting portion and lowering the same in a state of supporting the peripheral portion of the substrate.

A sixth characteristic of the present invention is a method of manufacturing substrates including a process of supporting a substrate by a supporting portion, the supporting portion being formed of a plate member for supporting the substrate, so as not to come into contact with the peripheral portion of the substrate and including at least one non-contact portion within a substrate placing plane of the plate member so as to communicate with the outside without coming into contact with the substrate, the non-contact portion which communicates with the outside having the gross opening area between 25% and 94% inclusive of the gross area of the substrate placing plane, a process of loading the substrate supported by the supporting portion into a reactor, a process of heat-treating the substrate supported by the supporting portion in the reactor, and a process of unloading the substrate after the heat treatment supported by the supporting portion from the reactor.

A seventh characteristic of the present invention is a heat treatment apparatus including a reactor for treating a substrate, and a supporting tool for supporting the substrate in the reactor, wherein the supporting tool includes a supporting portion that comes into contact with the substrate and a body portion for supporting the supporting portion, the supporting portion is formed of a plate member for supporting the substrate so as not to come into contact with a peripheral portion of the substrate, and the heat capacity of the plate member is set to a range between 61 J/K and 103 J/K inclusive.

An eighth characteristic of the present invention is a method of manufacturing substrates including a step of supporting the substrate by a supporting portion, the supporting portion being formed of a plate member for supporting the substrate so as not to come into contact with a peripheral portion of the substrate, the heat capacity of the plate member is set to a range between 61 J/K and 103 J/K inclusive, a step of loading the substrate supported by the supporting portion into a reactor, a step of heat-treating the substrate supported by the supporting portion in the reactor, and a step of unloading the substrate after the heat treatment supported by the supporting portion from the reactor.

Preferably, the heat capacity of the plate member is set to a range between 63 J/K and 96 J/K inclusive. Preferably, the heat capacity of the plate member is set to a range between 66 J/K and 91 J/K inclusive. Preferably, the heat capacity of the plate member is set to a range between 70 J/K and 84 J/K inclusive. Preferably, a non-contact portion which does not come into contact with the substrate is provided on the inner side with respect to the outer periphery of the substrate placing plane of the plate member. Preferably, the non-contact portion is provided concentrically with the substrate. Preferably, the non-contact portion is formed of a through hole or a spot facing. Preferably, the surface area of the non-contact portion is set to a range between 50% and 83% inclusive of the surface area of the entire substrate placing plane of the plate member. Preferably, the surface area of the non-contact portion is set to a range between 55% and 81% inclusive of the surface area of the entire substrate placing plane of the plate member. Preferably, the surface area of the non-contact portion is set to a range between 58% and 78% inclusive of the surface area of the entire substrate placing plane of the plate member. Preferably, the surface area of the non-contact portion is set to a range between 64% and 75% inclusive of the surface area of the entire substrate placing plane of the plate member. Preferably, the diameter of the plate member is set to a range between 63% and 70% inclusive of the diameter of the substrate. Preferably, the diameter of the substrate is 300 mm, and the diameter of the plate member is from 190 to 210 mm. Preferably, the surface roughness Ra of at least a portion of the plate member which comes into contact with the substrate is set from 1 μm to 100 μm. Preferably, the supporting tool is adapted to support a plurality of the substrates in a plurality of stages substantially horizontally while leaving spaces therebetween. Preferably, the body portion is formed of silicon carbide, and the supporting portion is formed of silicon or silicon carbide. Preferably, the supporting portion is formed with a layer of silicon oxide or silicon carbide or silicon nitride on the surface thereof. Preferably, the heat treatment is a treatment performed at a temperature of 1300° C. or higher.

ADVANTAGE OF THE INVENTION

According to the first characteristic of the present invention, since at least one non-contact portion which communicates with the outside without being contact with the substrate is provided on the substrate placing plane of the plate member which supports the substrate so as not to come into contact with the peripheral portion of the substrate, and the surface area of the non-contact portion is included in a range between 25% and 94% inclusive of the surface area of an area surrounded by an outer edge line of the substrate placing plane of the plate member, air existing between the substrate and the plate member may be released via the non-contact portion when placing the substrate on the plate member, whereby the slippage which occurs when placing the substrate on the supporting portion formed of the plate member can be positively prevented. According to the second characteristic of the present invention, since at least one non-contact portion which communicates with the outside without being contact with the substrate is provided on the substrate placing plane of the plate member for supporting the substrate so as not to come into contact with the peripheral portion of the substrate, and the heat capacity of the plate member is set to a range between 61 J/K and 103 J/K inclusive, the slip rate may fall within a practical range.

BRIEF DESCRIPTION OF THE DRAWINGS

FIG. 3 illustrates a supporting tool used in the first embodiment of the present invention, in which

FIG. 4 illustrates the supporting tool and a tweezer used in the first embodiment of the present invention, in which

FIG. 7 illustrates modifications of the first embodiment of the present invention, in which

FIG. 8 is an explanatory drawing in which a periphery non-supporting type and a periphery supporting type in the first embodiment of the present invention are compared.

FIG. 14 is a drawing showing a state of occurrence of slippage according to the difference of the distance (pitch) between the substrates.

Figure 1:
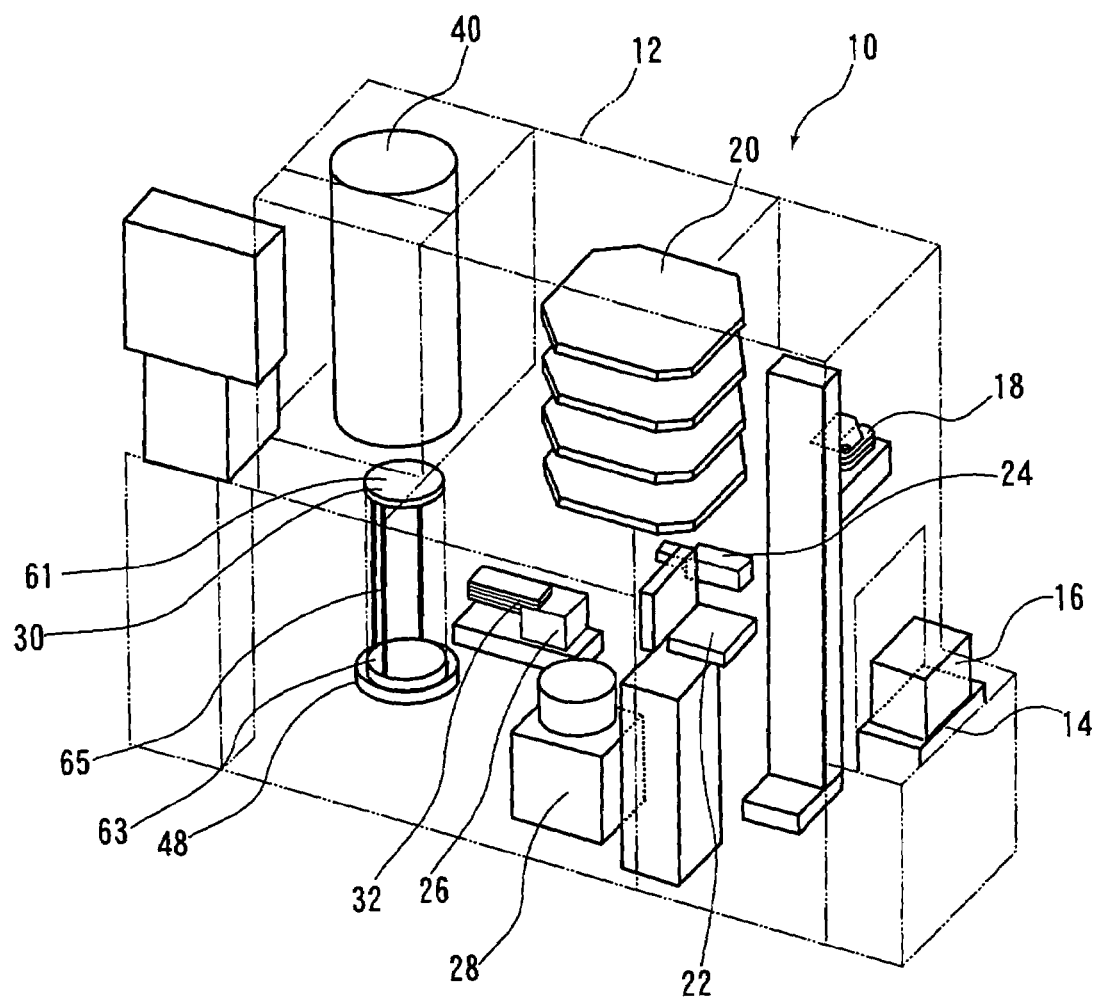
FIG. 1 is a perspective view showing a heat treatment apparatus according to a first embodiment of the present invention.

| Reference Numerals | |
| --- | --- |
| 10 | heat treatment apparatus |
| 26 | substrate transfer unit |
| 30 | supporting tool |
| 32 | tweezer |
| 40 | reactor |
| 54 | substrate |
| 57 | body portion |
| 58 | supporting portion |
| 70 | non-contact portion |
| 72 | through hole |
| 74 | arm |
| 82 | groove |

BEST MODE FOR CARRYING OUT THE INVENTION

Referring now to the drawings, embodiments of the present invention will be described.

FIG. 1 shows a heat treatment apparatus 10 according to a first embodiment of the present invention. The heat treatment apparatus 10 is a batch type vertically-installed heat treatment apparatus including a casing 12 in which a principal portion is arranged. A pod stage 14 is connected to the front side of the casing 12, and a pod 16 is transported to the pod stage 14. The pod 16 accommodates, for example twenty-five pieces of substrates and is mounted to the pod stage 14 in a state of being closed by a lid, not shown.

A pod transporting device 18 is arranged on the front side in the casing 12 at a position opposed to the pod stage 14. A pod shelf 20, a pod opener 22 and a substrate number sensor 24 are arranged in the vicinity of the pod transporting device 18. The pod shelf 20 is arranged above the pod opener 22, and the substrate number sensor 24 is arranged adjacently to the pod opener 22. The pod transporting device 18 transports the pod 16 among the pod stage 14, the pod shelf 20, and the pod opener 22. The pod opener 22 serves to open the lid of the pod 16, and the number of substrates in the pod 16 whose lid is opened is sensed by the substrate number sensor 24.

In the casing 12, a substrate transfer unit 26, a notch aligner 28, and a substrate supporting member (boat) 30 used as a supporting tool for supporting the substrates in a reaction container 43, described later, are arranged. The substrate transfer unit 26 includes an arm (tweezer) 32 that is able to take out, for example, five substrates, and the substrates are transported among the pod placed at a position of the pod opener 22, the notch aligner 28, and the substrate supporting member 30 by moving the arm 32. The notch aligner 28 detects notches or orientation flats formed on the substrates, and aligns the notches or the orientation flats of the substrates at a certain position.

A reactor 40 is arranged in the upper portion on the back side in the casing 12. The substrate supporting member 30 having the plurality of substrates mounted therein is transported into the reactor 40, where a heat treatment is performed.

Figure 2:
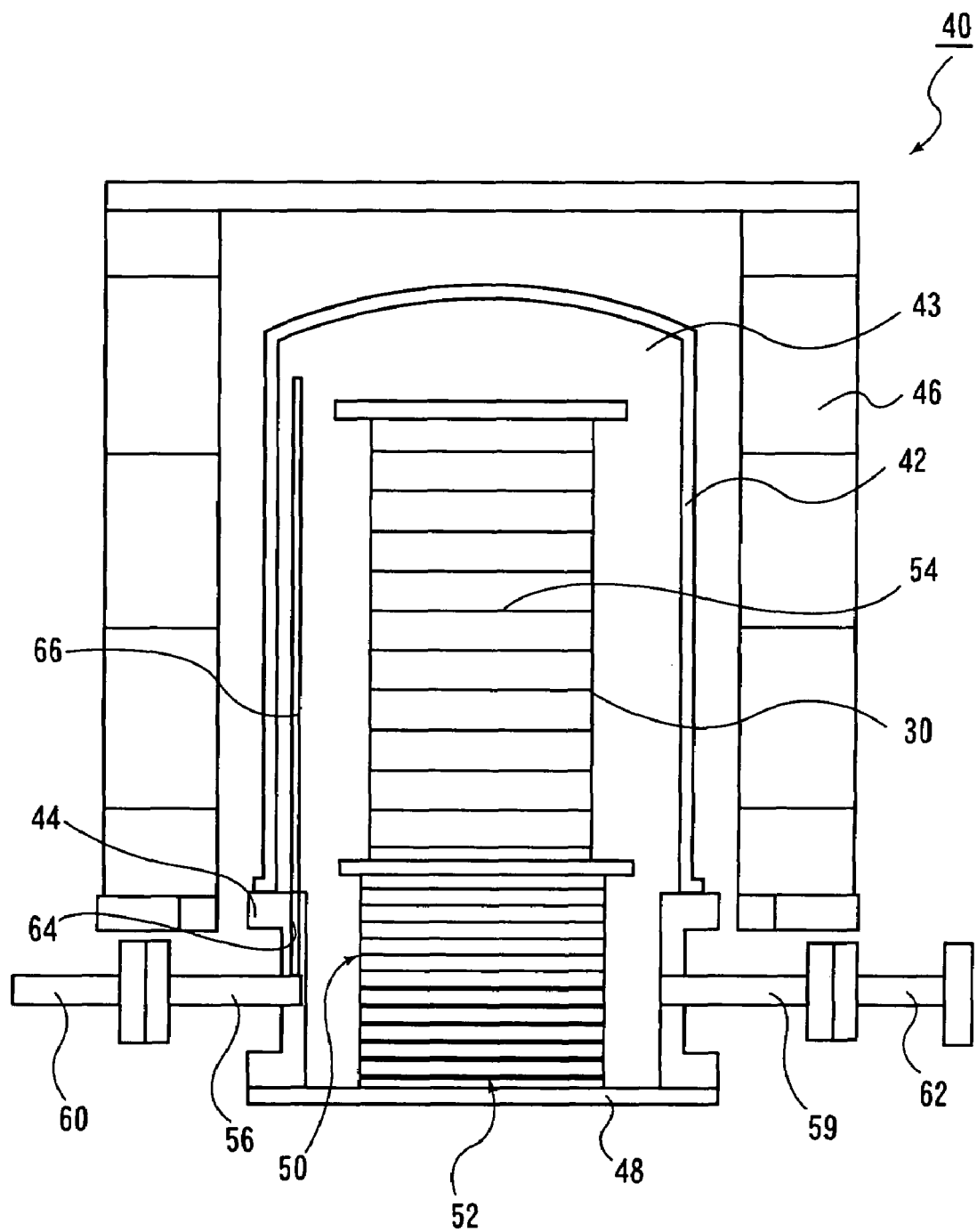
FIG. 2 is a cross-sectional view showing a reactor used in the first embodiment of the present invention.

FIG. 2 shows an example of the reactor 40. The reactor 40 includes a reaction tube 42 formed of silicon carbide (SiC). The reaction tube 42 has a cylindrical shape closed at the upper end thereof and opened at the lower end thereof, and the opened lower end is formed into a flange shape. An adaptor 44 formed of quartz is arranged below the reaction tube 42 so as to support the reaction tube 42. The adaptor 44 has a cylindrical shape opened on the upper end and the lower end thereof, and the opened upper end and the lower end are formed into a flange shape. The lower surface of a lower end flange of the reaction tube 42 abuts against the upper surface of an upper end flange of the adaptor 44. The reaction tube 42 and the adaptor 44 constitute a reaction container 43 for treating the substrates. A heater 46 is arranged around the reaction tube 42 of the reaction container 43 except for the adaptor 44.

The lower side of the reaction container 43 configured of the reaction tube 42 and the adaptor 44 is opened for inserting the substrate supporting member 30, and the opened portion (reactor port) is adapted to be sealed by a reactor port seal cap 48 coming into abutment with the lower surface of the lower end flange of the adaptor 44 with the intermediary of an O-ring. The reactor port seal cap 48 supports the substrate supporting member 30, and is provided so as to be capable of moving upward and downward with the substrate supporting member 30. Provided between the reactor port seal cap 48 and the substrate supporting member 30 are a first heat-insulating member 52 formed of quartz and a second heat-insulating member 50 formed of silicon carbide (SiC) arranged on the first heat-insulating member 52. The substrate supporting member 30 is mounted into the reaction tube 42 with a number of, for example, twenty-five to one hundred substrates 54 supported in a number of stages substantially horizontally while leaving spaces therebetween.

The reaction tube 42 is formed of SiC for enabling a treatment at a high temperature of 1200° C. or higher. When a configuration in which the reaction tube 42 formed of SiC is extended to the reactor port and the reactor port is sealed by the reactor port seal cap via the O-ring is employed, the temperature of the sealing portion is also increased to a high temperature by heat transmitted via the reaction tube formed of SiC, and hence the O-ring as a sealing material may be melted. When the sealing portion of the reaction tube 42 formed of SiC is cooled so as to prevent the O-ring from being melted, the reaction tube 42 formed of SiC becomes damaged due to the difference in thermal expansion caused by the temperature difference. Therefore, by configuring a heated area of the reaction container 43 heated up by the heater 46 with the reaction tube 42 formed of SiC, and configuring a portion other than the heated area heated up by the heater 46 with the adaptor 44 formed of quartz, transmission of heat from the reaction tube formed of SiC is alleviated, so that sealing of the reactor port is achieved without melting the O-ring and without giving damage to the reaction tube. As regards sealing between the reaction tube 42 formed of SiC and the adaptor 44 formed of quartz, since the reaction tube 42 formed of SiC is arranged in the heated area heated up by the heater 46, the temperature difference is not generated as long as the surface accuracy therebetween is good, and thermal expansion of the both is isotropic. Therefore, the lower end flange of the reaction tube 42 formed of SiC may be maintained to be a flat plane, and hence a gap is not generated with respect to the adaptor 44, so that sealing property can be secured only by placing the reaction tube 42 formed of SiC on the adaptor 44 formed of quartz.

The adaptor 44 is provided with a gas supply port 56 and a gas exhaust port 59 integrally with the adaptor 44. The gas supply port 56 is connected to a gas introduction pipe 60, and the gas exhaust port 59 is connected to an exhaust pipe 62, respectively. The thickness of the adaptor 44 in the circumferential direction is larger than the thickness of the reaction tube 42 in the same direction, and is also larger than the thickness of a nozzle 66, described later. An inner wall of the adaptor 44 is located inside (protruded) with respect to an inner wall of the reaction tube 42, and the side wall (thick portion) of the adaptor 44 is provided with a gas introduction path 64, which communicates with the gas supply port 56 and is oriented in the vertical direction, and is provided with a nozzle mounting hole at an upper portion thereof so as to open upward. The nozzle mounting hole is opened to the upper surface of the adaptor 44 on the side of the upper end flange in the reaction tube 42, and communicates with the gas supply port 56 and the gas introduction path 64. The nozzle 66 is inserted and fixed to the nozzle mounting hole. That is, the nozzle 66 is connected to the upper surface of the adaptor 44 at a portion protruded inwardly with respect to the inner wall of the reaction tube 42 in the reaction tube 42, and hence the nozzle 66 is supported on the upper surface of the adaptor 44. In this configuration, the nozzle connected portion may be prevented from being deformed or being damaged easily due to heat. There is also a merit that assembly and decomposition of the nozzle 66 and the adaptor 44 are facilitated. The treatment gas introduced from the gas introduction pipe 60 to the gas supply port 56 is supplied into the reaction tube 42 via the gas introduction path 64 and the nozzle 66 provided on the side wall of the adaptor 44. The nozzle 66 is configured so as to extend vertically to a point above the upper end of a substrate arranged area (above the upper end of the substrate supporting member 30) along the inner wall of the reaction tube 42.

Subsequently, an operation of the heat treatment apparatus 10 configured as described above will be described.

When the pod 16 in which the plurality of substrates are stored is mounted to the pod stage 14, the pod 16 is transported from the pod stage 14 to the pod shelf 20 by the pod transporting device 18 and is stocked on the pod shelf 20.

Subsequently, the pod 16 stocked on the pod shelf 20 is transported to the pod opener 22 by the pod transporting device 18 and is mounted thereto, the lid of this pod 16 is opened by the pod opener 22, and the number of substrates stored in the pod 16 is sensed by the substrate number sensor 24.

Subsequently, the substrates are taken out from the pod 16 positioned at the pod opener 22 by the substrate transfer unit 26, and are transferred to the notch aligner 28. The notch aligner 28 detects notches while rotating the substrates, and aligns the notches of the plurality of substrates at the same position on the basis of detected information. Then, the substrates are taken out from the notch aligner 28 and are transferred to the substrate supporting member 30 by the substrate transfer unit 26.

In this manner, when a batch of the substrates are transferred to the substrate supporting member 30, the substrate supporting member 30 in which the plurality of substrates 54 are mounted is loaded into the reactor 40 (the reaction container 43) which is set to a temperature on the order of, for example, 600° C., and the reactor 40 is sealed by the reactor port seal cap 48. Then, the temperature in the reactor is increased to a heat treatment temperature, and treatment gas is introduced into the reaction tube 42 from the gas introduction pipe 60 through the gas introduction port 56, the gas introduction path 64 provided on the side wall of the adaptor 44, and the nozzle 66. The treatment gas includes nitrogen ($N_2$), Argon (Ar), hydrogen ($H_2$), oxygen ($O_2$), hydrogen chloride (HCl), and dichloroethylene ($C_2H_2Cl_2$, abbreviated as DCE). When heat-treating the substrate 54, the substrates 54 are heated up to a temperature on the order of, for example, 1200° C. or higher.

When the heat treatment of the substrates 54 are terminated, the reactor temperature is lowered to a temperature on the order of, for example, 600° C., then the substrate supporting member 30 supporting the substrates 54 after having applied the heat treatment is unloaded from the reactor 40, and the substrate supporting member 30 is caused to stay at a predetermined position until all the substrates 54 supported by the substrate supporting member 30 are cooled down. Subsequently, when the substrates 54 in the substrate supporting member 30 which has been caused to stay are cooled down to a predetermined temperature, the substrates 54 are taken out from the substrate supporting member 30 by the substrate transfer unit 26, and are transported to and stored in the empty pod 16 mounted to the pod opener 22. Subsequently, the pod 16 in which the substrates 54 are stored is transported to the pod shelf 20 or to the pod stage 14 by the pod transporting device 18 to complete the procedure.

Subsequently, the supporting tool 30 provided in the heat treatment apparatus 10 according tot the first embodiment will be descried in detail.

Figure 3A:
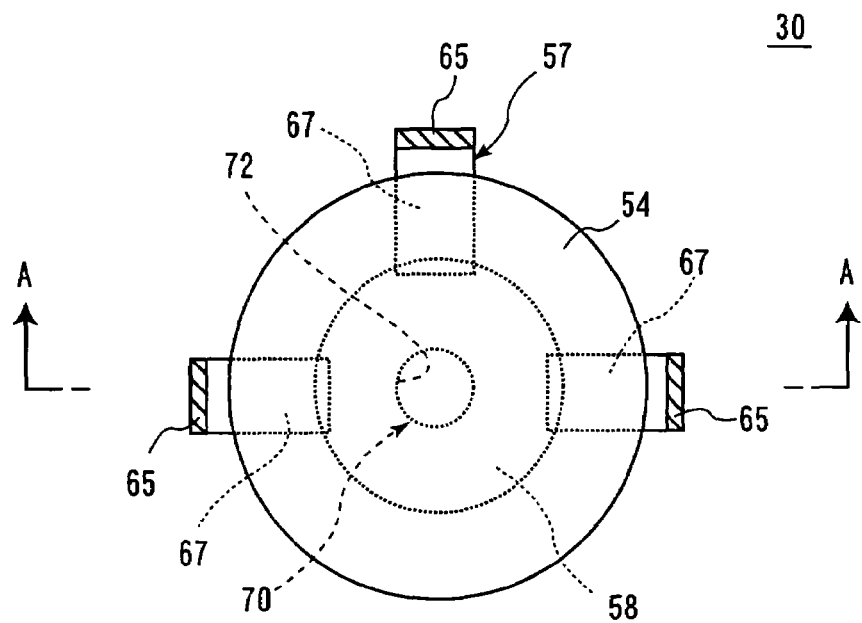
FIG. 3(a) is a plane cross-sectional view.
Figure 3B:
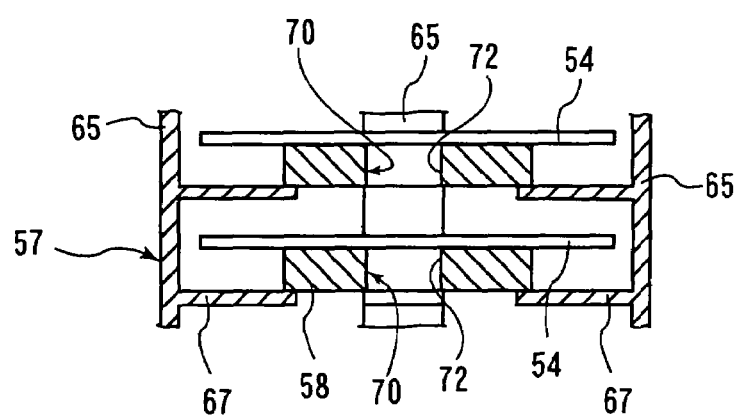
FIG. 3(b) is a cross-sectional view taken along the ling A-A in FIG. 3(a).

FIG. 3 is a schematic drawing showing the supporting tool 30. FIG. 3(*a*) is a plan cross-sectional view, and FIG. 3(*b*) is a cross-sectional view taken along the line A-A in FIG. 3(*a*).

The supporting tool 30 includes supporting portions 58 that come into contact with the substrates 54, and a body portion 57 that supports the supporting portions 58. The body portion 57 is formed of, for example, silicon carbide (SiC) or silicon carbide impregnated with silicon, and includes an upper plate 61 formed into a disc shape (shown in FIG. 1), a lower plate 63 also formed into a disc shape (shown in FIG. 1), for example, three pillars 65, 65, 65 for connecting the upper plate 61 and the lower plate 63, and supporting strips 67, 67, 67 extending from the pillars 65, 65, 65. The pillars 65, 65, 65 are arranged so as to apart from each other by 90°, and two on the side where the tweezer 32 is inserted at 180° apart from each other, and one on the opposite side from the side where the tweezer 32 is inserted. The supporting strips 67, 67, 67 extend horizontally from the pillars 65, 65, 65. A number of the supporting strips 67, 67, 67 are formed on the pillars 65, 65, 65 at regular distances in the vertical direction, and the plate-shaped supporting portions 58 are supported by a number of the supporting strips 67, 67, 67 respectively. The substrate 54 is supported in such a manner that the lower surface of the substrate 54 comes into contact with the upper surface of the supporting portion 58. That is, the body portion 57 is configured to support the plurality of supporting portions 58 in the horizontal posture in a number of stages at intervals, whereby the plurality of substrates 54 are supported in the horizontal posture in a number of stages at intervals.

The supporting portions 58, being formed of a for example, silicone (Si) such as monocrystal silicon (Si), or polycrystal silicon (Poly-Si), or of silicon carbide (SiC), are formed of plate members for supporting the substrates 54 so as not to come into contact with peripheral portions of the substrates 54, and are formed into a disk shape (column shape).

The diameter of the supporting portion 58 is smaller than the diameter of the substrate 54. That is, the surface area of the upper surface of the supporting portion 58 is smaller than the surface area of a flat surface, which is the lower surface of the substrate 54, and the substrate 54 is supported by the supporting portion 58 with the peripheral edge of the substrate 54 remained (without coming into contact with the peripheral portion of the substrate). The diameter of the substrate 54 is, for example, 300 mm, and in this case, the diameter of the supporting portion 58 is smaller than 300 mm, preferably on the order from 100 mm to 250 mm (on the order of ⅓ to ⅚ of the diameter of the substrate), and more preferably, from 190 mm to 210 mm (63% to 70% of the diameter of the substrate).

The thickness of the supporting portion 58 is larger than the thickness of the substrate 54. The thickness of the substrate 54 is, for example, 700 μm, and hence the thickness of the supporting portion 58 is larger than 700 μm, which may be as thick as 10 mm at a maximum, and preferably, is larger than at least twice the thickness of the substrate 54, for example, 3 mm to 10 mm. The thickness of the supporting portion 58 is larger than the thickness of the supporting strips 67, 67, 67. With such thickness of the supporting portion 58, rigidity of the supporting portion 58 may be increased, so that deformation of the supporting portion 58 by the temperature change when loading the substrates, when unloading the substrate, when increasing the temperature, when lowering the temperature, when heat-treating, and so on can be restrained. Accordingly, occurrence of slippage of the substrates 54 due to the deformation of the supporting portions 58 is prevented. Since the material of the supporting portions 58 is silicon which is the same material as the substrate 54, that is, a material having the same coefficient of thermal expansion and the hardness as the silicon substrate 54, the difference in thermal expansion or thermal contraction between the substrates 54 and the supporting portions 58 caused by the temperature change is avoided, and even when a stress is generated at contact points between the substrates 54 and the supporting portions 58, the stress can easily be released, so that likelihood of formation of scratches on the substrates 54 may be reduced. Accordingly, occurrence of slippage of the substrates 54 caused by the difference in coefficient of thermal expansion and in hardness between the substrates 54 and the supporting portions 58 may be prevented.

An adhesion preventing layer for preventing adhesion between the supporting portions 58 and the substrates 54 due to heat treatment is formed on the upper surface (substrate placing plane) of the supporting portion 58. The adhesion preventing layer is formed of a material superior in heat resistance and abrasion resistance such as silicon nitride film (SiN), silicon carbide film (SiC), silicon oxide film ($SiO_2$), vitreous carbon, crystallite diamond formed, for example, by treating a silicon surface, or by deposition on the silicon surface via the CVD or the like.

The supporting portion 58 is formed with at least one non-contact portion 70 that communicates with the outside without coming into contact with the substrate 54 on the substrate placing plane. The non-contact portion 70 is provided at least at the center of the substrate placing plane, and in this embodiment, the non-contact portion 70 is configured with a through hole 72. The through hole 72 is provided at the center of the supporting portion 58 concentrically with the substrate 54, and is formed to have a cylindrical shape having a cross section of a circle concentric with the substrate 54. One end of the through hole 72 opens through the substrate placing plane of the supporting portion 58, and the other end opens through a lower surface of the supporting portion 58 so as to communicate with the outside. The surface area of the opening of the through hole 72 in communication with the outside, which corresponds to the surface area of the non-contact portion is the surface area of an area surrounded by an outer edge line of the substrate placing plane of the plate member, which is included in a range between 25% to 94% inclusive of the gross area of the substrate placing plane. The through hole 72 is not limited to one, but a plurality of through holes 72 may be provided, for example, the plurality of through holes 72 may be provided around the through hole 72 at the center. The through hole 72 may not be provided at the center of the substrate placing plane, and the plurality of the through holes 72 may be provided at portions other than the center. In this case, the gross opening area of the opening of the plurality of through holes 72 which communicate with the outside is determined to fall into the range between 25% and 94% inclusive of the gross area of the substrate placing plane. The gross opening area of the through holes 72 is the sum of the opening areas of the respective through holes 72, and the gross area of the substrate placing plane is the summation of the gross area of the opening of the through holes 72 and the surface area of the portion where the through holes 72 are not opened. The reason why the gross opening area of the through holes 72 is defined will be described later.

Referring now to FIG. 4, the relationship among the tweezer 32, the supporting tool 30 and the substrates 54, and the operation relating the movement of the tweezer 32 will be described.

Figure 4A:
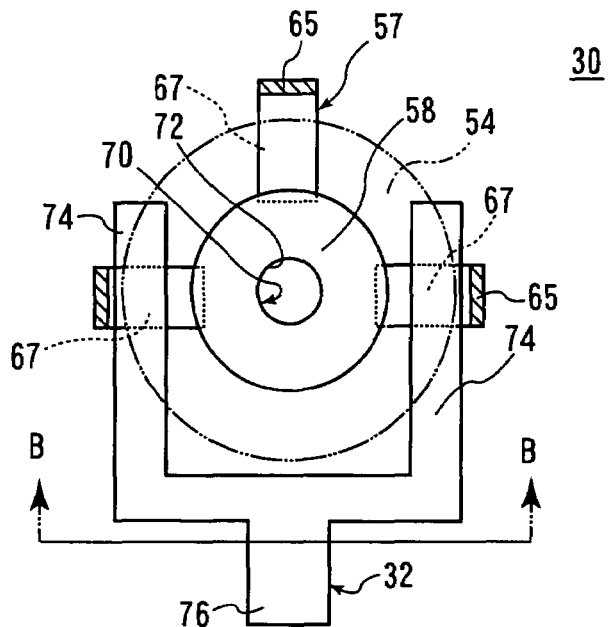
FIG. 4(a) is a plan cross-sectional view showing a state in which the tweezer and the substrate are inserted into the supporting tool.
Figure 4B:
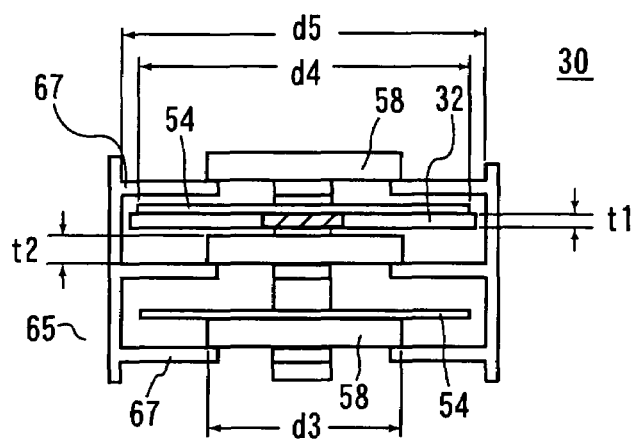
FIG. 4(b) is a cross-sectional view taken along the line B-B in FIG. 4(a)
Figure 4C:
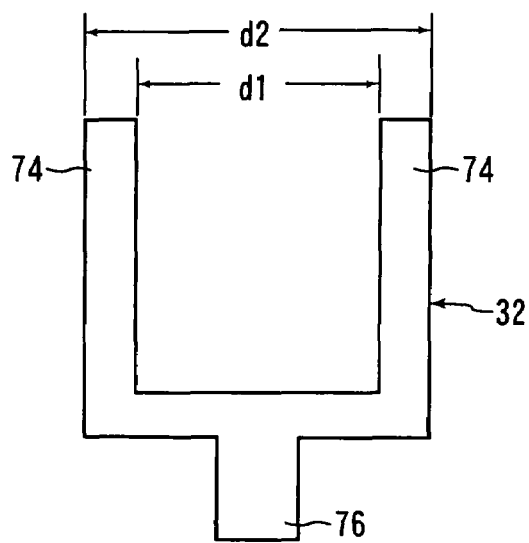
FIG. 4(c) is a plan view showing the tweezer.
Figure 5A:
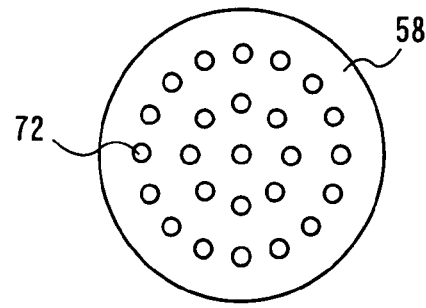
FIG. 5 is a plan view showing supporting portions of various types that the inventors used in an experiment.
Figure 5B:
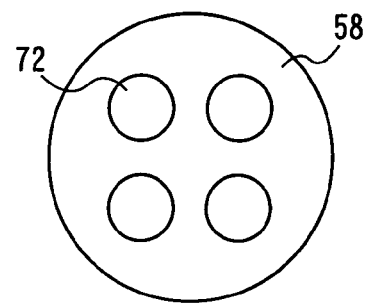
Figure 5C:
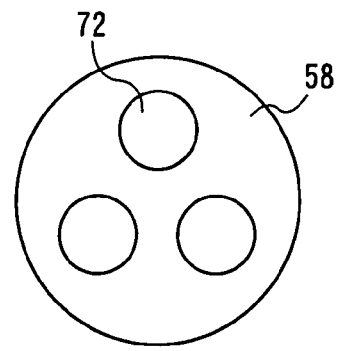
Figure 5D:
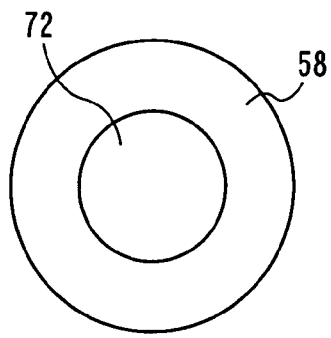

FIG. 4(a) is a plan cross-sectional view showing a state in which the tweezer 32 and the substrate 54 are inserted into the supporting tool 30, FIG. 4(b) is a cross-sectional view taken along the line B-B in FIG. 4(a), and FIG. 4(c) is a plan view showing the tweezer 32. The tweezer 32 has a U-shape, and two arm portions 74, 74 extend in parallel from a tweezer body 76. The inner distance d1 between the two arm portions 74, 74 is larger then the diameter d3 of the supporting portion 58, and is smaller than the diameter d4 of the substrate 54. The outer distance d2 between the two arm portions 74, 74 is equal to or slightly larger than the diameter d4 of the substrate 54, and is smaller than the inner distance d5 between the two pillars 65, 65 on the tweezer-insertion side. The diameter d4 of the substrate 54 is larger than the diameter d3 of the supporting portion 58, and is smaller than the inner distance d5 of the two pillars 65, 65 on the tweezer-insertion side. The thickness t1 of the arm portions 74, 74 is smaller than the thickness t2 of the supporting portion 58.

Since the inner distance d1 of the arm portions 74, 74 is smaller than the diameter d4 of the substrate 54, the peripheral portion of the substrate 54 can be supported by the arm portions 74, 74. That is, the substrate transfer unit is configured to support the peripheral portion of the substrate and, when transferring the substrate 54 to the supporting tool 30 by the substrate transfer unit, the peripheral portion of the substrate 54 is supported by the arm portions 74, 74, then in a state in which the substrate 54 is supported, the arm portions 74, 74 of the tweezer 32 is inserted into the supporting tool 30. At this time, since the outer distance d2 between the arm portions 74, 74 and the diameter d4 of the substrate 54 are smaller than the inner distance d5 between the two pillars 65, 65 on the tweezer-insertion side, the substrate 54 and the arm portions 74, 74 can be inserted between the two pillars 65, 65 on the tweezer-insertion side. Here, the vertical position of the arm portions 74, 74 is controlled by the substrate transfer unit so that the substrate 54 is floated (kept apart) from the supporting portion 58, and the substrate 54 stops at a position concentric with the supporting portion 58 above the substrate placing plane of the supporting portion 58 by a predetermined distance. This state is shown in FIG. 4(*b*). Subsequently, the tweezer 32 is lowered at a predetermined transfer velocity from the state in which the substrate 54 is floated from the supporting portion 58. The transfer velocity (the tweezer lowering velocity) is 1 to 5 mm/sec, preferably, 3 to 4 mm/sec. Since the inner distance d1 between the arm portions 74, 74 is larger than the diameter d3 of the supporting portion 58, the diameter d4 of the substrate 54 is larger than the diameter d3 of the supporting portion 58, and the thickness t1 of the arm portions 74, 74 is smaller than the thickness t2 of the supporting portion 58, when the tweezer 32 is lowered, the substrate 54 is placed on the substrate placing plane of the supporting portion 58. At this time, air between the back surface of the substrate 54 and the substrate placing plane of the supporting portion 58 is compressed when the substrate 54 is lowered. However, the compressed air is released to the outside (the outside on the side of the lower surface of the supporting portion 58) via the through holes 72, and hence the substrate 54 is prevented from slipping on the substrate placing plane of the supporting portion 58. In order to prevent the slippage of the substrate 54 by discharging air between the substrate 54 and the supporting portion 58 sufficiently when the transfer velocity is set to 1 to 5 mm/sec, the gross opening area of the through holes 72 must be at least 25% of the gross area of the substrate placing plane.

By performing lowering of the tweezer 32 slowly without forming the through holes 72 as in the above-described embodiment (such as to be stationary for about 5 second in a state in which the substrate 54 is in contact with the supporting portion 58), the slippage of the substrate 54 can be solved. However, it is not realistic since there is a demand to minimize the transfer time of the substrate 54 during manufacturing or fine adjustment of the distance and the angle between the respective tweezers 32 is required for brining the plurality of substrates 54 into contact with the supporting portions 58 simultaneously when transferring two or more (five, for example) substrates simultaneously. Therefore, it is preferable to form the through holes 72 as in the above-described embodiment in terms of productivity, difficulty of fine adjustment of the respective tweezers in the simultaneous transfer of the plurality of substrates, and accuracy of finishing of the tweezers.

After the substrate 54 is placed on the substrate placing plane of the supporting portion 58, the arm portions 74, 74 control the vertical position of the tweezer 32 so as to stop at a position between the substrate 54 and the supporting strips 67, 67 by the substrate transfer unit, and move (pull out) the tweezer 32 from this stop position in the horizontal direction, so that transfer of one or a plurality of the substrates 54 is completed. Then, by repeating such sequence, a number of substrates 54 are transferred to the supporting tool 30.

Subsequently, the reason why the gross opening area of at least one through hole 72 that communicates with the outside is determined to fall in a range between 25% and 94% inclusive of the gross area of the substrate placing plane will be described.

The reason why the lower limit value is determined to be 25% is as follows.

The present inventors formed various types of though holes as shown in FIGS. 5(*a*) to (*d*) on the supporting portions under the conditions that the diameter of the supporting portions (plate member) is fixed to 200 mm and the thickness to 6 mm to 7 mm, and conducted an experiment to automatically transfer silicon wafers of 12 inches (silicon wafers of 300 mm in diameter) as substrates on the supporting portions, and inspected whether the slippage occurs or not on the substrates in the respective cases. The result is shown in Table 1. A type "porous" in Table 1 indicates a type formed with a number of through holes 72 regularly on the supporting portion 58, as shown in FIG. 5(*a*). A type "four holes" in Table 1 indicates a type formed with four through holes 72 in total so that the centers of the through holes 72 are located on a concentric circle of the supporting portion 58 as shown in FIG. 5(*b*). A type "three holes" in Table 1 indicates a type formed with three through holes 72 in total so that the centers of the through holes 72 are located on a concentric circle of the supporting portion 58, as shown in FIG. 5(*c*). A type "one hole (ring)" in Table 1 indicates a type formed with one hole at a center of the supporting portion 58 and having a ring shape, as shown in FIG. 5(*d*). The transfer velocity is 3 to 4 mm/sec.

[Table 1]

TABLE 1

Relation Between Rate of Through Holes and Presence of Slippage
Circle: No slippage occurred
Triangle: Little slippage occurred (slippage may occur)
Cross: Slippage occurred

| TYPE | Inner Diameter of Through Hole × Number of Through Holes (mm) | Gross Opening Area of Through Holes (mm²) | Gross Area of Placing Plane (mm²) | Contact Area (mm²) | Rate of Through Holes (%) | Slippage |
|---|---|---|---|---|---|---|
| Porous | 6 × 29 | 820 | 31400 | 30580 | 2.6 | Δ |
| Four holes | 20 × 4 | 1256 | 31400 | 30144 | 4 | Δ |

TABLE 1-continued

Relation Between Rate of Through Holes and Presence of Slippage
Circle: No slippage occurred
Triangle: Little slippage occurred (slippage may occur)
Cross: Slippage occurred

| TYPE | Inner Diameter of Through Hole × Number of Through Holes (mm) | Gross Opening Area of Through Holes (mm²) | Gross Area of Placing Plane (mm²) | Contact Area (mm²) | Rate of Through Holes (%) | Slippage |
|---|---|---|---|---|---|---|
| One hole (ring) | 80 × 1 | 5024 | 31400 | 26376 | 16 | △ |
| Three holes | 50 × 3 | 5888 | 31400 | 25512 | 18.8 | △ |
| Four Holes | (50-60) × 4 | 7850-11304 | 31400 | 3061-20096 | 25-36 | ○ |
| One hole (ring) | (100-180) × 1 | 7850-28339 | 31400 | 3061-23550 | 25-90 | ○ |

*Percentage of the through holes (%) = {Gross Opening Area of the Through Holes (mm²)/Gross Area of Placing Plane (mm²)} × 100

As shown in Table 1, when the gross area of the through hole openings is 2.6% or more of the substrate placing surface, little slippage of the substrate occur. However when it is smaller than 25%, the slippage may occur, and hence prevention of the slippage is ensured. It is considered that it is because air between the back surface of the substrate and the substrate placing plane of the supporting portion is not satisfactorily discharged when the substrate is placed, and a force that the air compressed by placing the substrate presses the substrate cannot controlled satisfactorily. In order to discharge air between the substrate and the supporting portion sufficiently, control the force that the compressed air presses the substrate sufficiently, and ensure prevention of the slippage of the substrate, it is necessary to determine the gross area of the through hole openings to be 25% or more of the gross area of the substrate placing plane.

Subsequently, the reason why the upper limit is set to 94% is as follows.

Figure 6A:
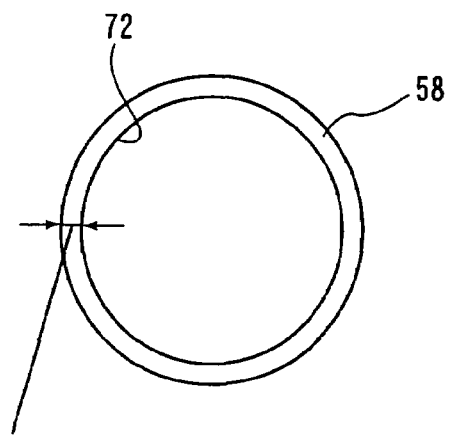
FIG. 6 is a plan view of the supporting portion for explaining the reason why the gross area of through hole openings is set to 94% or smaller of the gross area of the substrate placing plane.
Figure 6B:
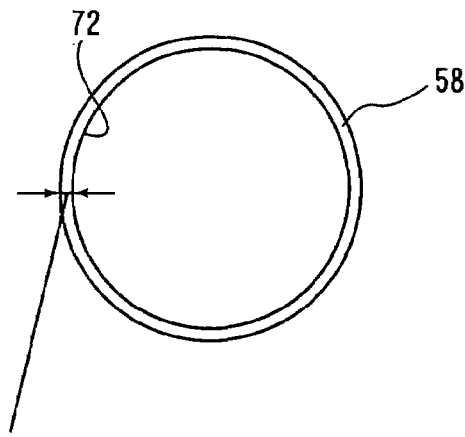

When the gross area of the through hole openings is determined to be larger than 90% of the gross area of the substrate placing plane, although prevention of the slippage of the substrate is ensured, the width of the portion that comes into contact with the substrate on the supporting portion is significantly reduced. Therefore, when forming the though holes by the machining process, the corresponding portion may be broken, and hence machining becomes difficult. When the supporting portion is formed into a disc shape as in this embodiment, as shown in FIG. 6(a), the machining limit of the width of the portion that comes into contact with the substrate is on the order of 5 mm (the gross area of the through hole openings at this time is 90% of the gross area of the substrate placing plane), and when it is smaller, it may be broken at the time of machining. When machining with laser or the like, the gross area of the through hole openings may be determined to be larger than 90% of the gross area of the substrate placing plane (cost is increased, however). When it is determined to be larger than 94%, the supporting portion 58 is deformed by the temperature variation which occurs when the substrate is loaded and unloaded into/from the reactor, when the temperature of the substrate increases and decreases, and during heat treatment, so that occurrence of slippage may be resulted. When the supporting portion 58 is formed into a disc shape as in this embodiment, as shown in FIG. 6(b), the limit of strength of the width of the portion which comes into contact with the substrate under the heat variation is on the order of 3 mm (the gross area of the through hole openings at this time is 94% of the gross area of the substrate placing plane), and when it is smaller, deformation may be resulted under the heat variation. That is, when considering the machining limit in the machining process, it is necessary to determine the gross area of the through hole openings to be 90% or smaller of the gross area of the substrate placing plane. Therefore, when considering the limit of the strength of the supporting portion 58 under the temperature variation, it is necessary to determine the gross area of the through hole opening to be 94% or lower of the gross area of the substrate placing plane.

From the description given thus far, in order to ensure prevention of the slippage of the substrate when placing the substrate and to prevent the supporting portion from being deformed under the temperature variation, it is necessary to determine the gross area of the through holes to be at least a range between 25% and 94% inclusive of the gross area of the substrate placing plane. By determining the gross area of the through hole openings to fall within such range, adhesion between the substrate and the supporting portion due to heat treatment may also be prevented. The gross area of the through holes is determined to be 65% of the gross area of the substrate placing plane or smaller, the rigidity of the supporting portion 58 can be enhanced, and hence the supporting portion 58 by itself is preferably little deformed.

Figure 7B:
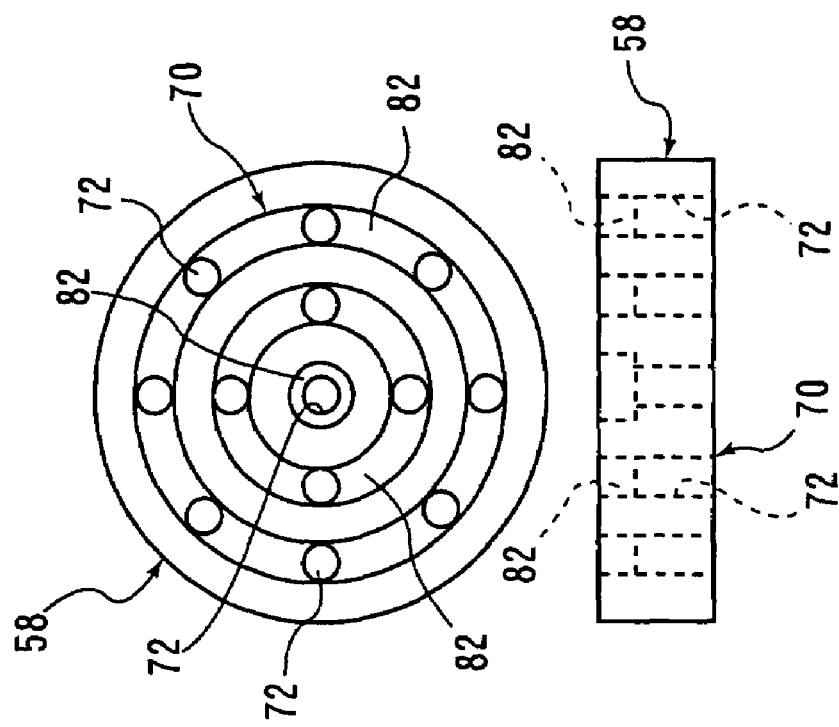
FIG. 7(b) shows a plan view and a side view of a second modification.

Referring now to FIG. 7, a modification of the supporting portion 58 provided in the heat treatment apparatus 10 according to the first embodiment.

Figure 7A:
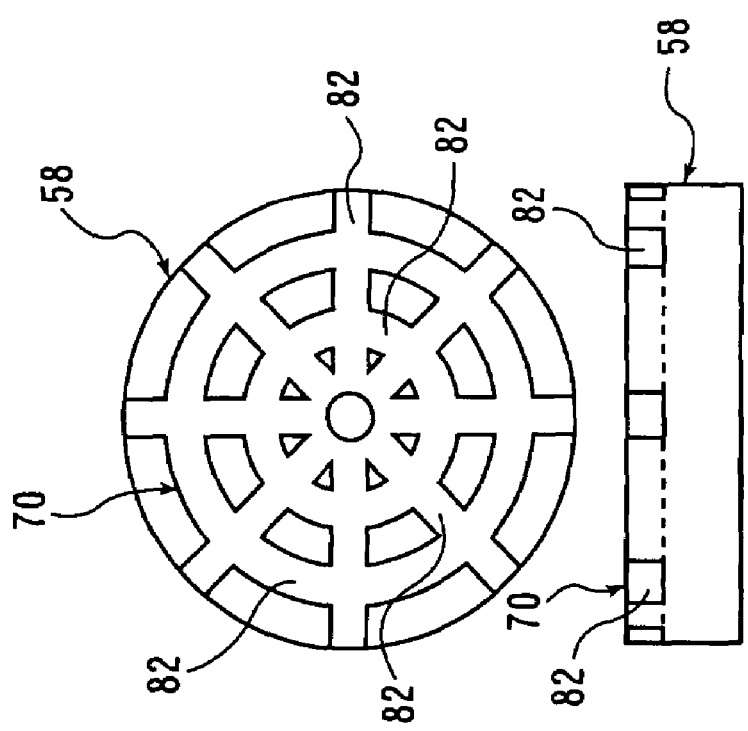
FIG. 7(a) shows a plan view and a side view of a first modification.

FIG. 7(a) shows a plan view and a side view of the supporting portion 58 in the first modification. In the first modification, the non-contact portion 70 which is a portion that does not come into contact with the substrate is configured as a groove 82. The groove 82 is formed on the substrate placing plane of the supporting portion 58, and includes those extending in the radial directions and those formed concentrically, which intersect with each other. An end of each of the radial grooves 82 opens through a side surface of the supporting portion 58, and communicates with the outside through the side surface of the supporting portion 58. In the first modification, the gross area of the openings of the grooves 82 through the substrate placing plane may be determined to be between 25% and 94% inclusive of the gross area of the substrate placing plane.

FIG. 7(*b*) shows a plan view and a side view of the supporting portion 58 in the second modification. In the second modification, the non-contact portion 70 includes a combination of the through holes 72 and the grooves 82. That is, the groove 82 is formed around the through hole 72 formed at the center of the supporting portion 58 and a plurality of the grooves 82 are formed on the substrate placing plane concentrically. A plurality of the through holes 72 are formed in the grooves 82 at predetermined intervals, so that one end of each of the through holes 72 opens into the groove 82, and the other end thereof opens through the lower surface of the supporting portion 58 so as to communicate with the outside. In the second modification, the gross area of the grooves 82 opening through the substrate placing plane may be determined to be a range between 25% and 94% inclusive of the gross area of the substrate placing plane.

There is a supporting portion of a type that supports the peripheral portion of the substrate and does not come into contact with the center of the substrate such as annulus ring-shape (flat C-shape and flat O-shape) (hereinafter, referred to as "periphery supporting type"). The supporting portion in this embodiment is different from this type, and supports the center of the substrate and does not come into contact with the peripheral portion of the substrate (hereinafter, referred to as "periphery non-supporting type). Hereinafter, referring to FIG. 8, the difference between a case in which the substrate is transferred to the supporting portion of the periphery non-supporting type in this embodiment, and a case in which the substrate is transferred to the supporting portion of the periphery supporting type will be described. FIG. 8(*a*) shows a state in which the substrate is supported by the tweezer, FIG. 8(*b*) shows a state in which the tweezer is lowered and the substrate comes into contact with the supporting portion, and FIG. 8(*c*) shows a state in which the tweezer is further lowered and the substrate is supported by the supporting portion. The warp of the substrate is exaggerated for ease of understanding.

1) How the Substrate is Supported When the Substrate is Transported and How the Substrate is Warped As shown in FIG. 8(*a*), since the supporting portion of the periphery non-supporting type in the embodiment of the present invention supports the peripheral portion of the substrate 54 by the tweezer 32 when the substrate is transported, the center of the substrate is warped downward with respect to the peripheral portion by the self-weight of the substrate. In contrast, in the case of the supporting portion of the periphery supporting type, since the center of the substrate is supported by the tweezer, the peripheral portion of the substrate is warped downward with respect to the center by the self-weight of the substrate.

2) How the Substrate and the Supporting Portion Come into Contact with Each Other When the Substrate is Placed (When No Through Hole is Formed on the Supporting Portion), How the Substrate is Supported, and How the Substrate is Warped As shown in FIG. 8(*b*), in the case of the periphery non-supporting type in the embodiment of the present invention, the center of the substrate comes into contact with the center of the supporting portion first when the substrate is placed, and then, comes into contact with the outside of the center gradually as the tweezer 32 is lowered, so that the peripheral portion of the substrate is supported by the tweezer 32 and the center of the substrate is supported by the supporting portion 58. The direction of warp of the substrate 54 is inverted from the state of being transported as the tweezer 32 is lowered. In contrast, in the case of the supporting portion of the periphery supporting type, the edge portion of the substrate comes into contact with the peripheral portion of the supporting portion, comes into contact with the inner side thereof gradually as the tweezer is lowered, so that the center of the substrate is supported by the tweezer, and the peripheral portion of the substrate is supported by the supporting portion. The direction of warp of the substrate is inverted from the state of being transported as the tweezer 32 is lowered.

3) How the Substrate is Supported When Being Supported, and How the Substrate is Warped As shown in FIG. 8(*c*), in the case of the supporting portion of the periphery non-supporting type in this embodiment, since the supporting portion 58 supports the center of the substrate 54 and is not in contact with the peripheral portion of the substrate 54 when the substrate is supported, the peripheral portion of the substrate is warped downward with respect to the center of the substrate by the self-weight of the substrate. In contrast, in the supporting portion of the periphery supporting type, the supporting portion supports the peripheral portion of the substrate, and is not in contact with the center of the substrate. Therefore, the center of the substrate is warped downward with respect to the peripheral portion of the substrate by the self-weight of the substrate.

4) The Amount of Slippage (Extent of Slippage)

In the case of the supporting portion of the periphery non-supporting type in this embodiment, while the amount of slippage of the substrate with respect to the supporting portion in the case in which no through hole is formed is on the order of 4 to 5 mm to 10 mm, it is on the order of 3 mm to 5 mm in the supporting portion of the periphery supporting type. Therefore, the extent of slippage of the substrate with respect to the supporting portion is relatively large in the case of the periphery non-supporting type in this embodiment, while it is relatively small in the supporting portion of the periphery supporting type.

As described above, the supporting portion of the periphery non-supporting type and the supporting portion of the periphery supporting type in the first embodiment of the present invention are different in how the substrate is supported (supported points) and how the substrate is warped (a) when the substrate is transported, (b) when the substrate is placed, and (c) when the substrate is supported, and are different also in how the substrate comes into contact with the supporting portion (b) when the substrate is placed. Therefore, how air between the back surface of the substrate and the upper surface of the supporting portion (the substrate placing plane) is released is different, a force that the air compressed when the substrate is placed presses the substrate is different, and the amount of slippage (extent of slippage) of the substrate is also different.

That is, how the substrate slips on the supporting portion is different between the supporting portion of the periphery non-supporting type as in the first embodiment of the present invention and the supporting portion of the periphery supporting type. Therefore, the critical value of the gross area of the through hole openings for preventing occurrence of slippage is also different. For example, in the case of the supporting portion of the periphery non-supporting type as in the first embodiment of the present invention, as described above, it is necessary to determine the gross area of the through hole openings to be at least 25% of the gross area of the substrate placing plane in order to positively prevent occurrence of slippage. On the other hand, in the case of the supporting portion of the periphery supporting type, it is considered that occurrence of slippage may be prevented by determining the gross area of the through hole openings to be on the order of 0.5% of the gross area of the substrate placing plane.

As described above, according to the first embodiment of the present invention, the critical value of the gross area of the through hole openings for preventing slippage of the substrate which is specific when placing the substrate on the supporting portion of the type which does not come into contact with the peripheral portion of the substrate was found.

A second embodiment of the present invention will be described below on the basis of the drawings.

The general configurations of the heat treatment apparatus 10 and the reactor 40 in the second embodiment are the same as the aforementioned heat treatment apparatus 10 and the reactor 40 in the first embodiment described in conjunction with FIG. 1 and FIG. 2. The general structure of the supporting tool 30 in the second embodiment is the same as the supporting tool 30 in the first embodiment other than a spot facing 58*a* provided on the supporting portion 58 or the size of a through hole 58*b*. Different portions from the first embodiment will be mainly described here.

The supporting tool 30 in the second embodiment is shown in FIGS. 9 to 12.

The supporting portion 58 is provided with at least one spot facing 58*a* or through hole 58*b* for reducing the heat capacity of the supporting portion 58 itself as shown in FIGS. 9 to 12.

Figure 9A:
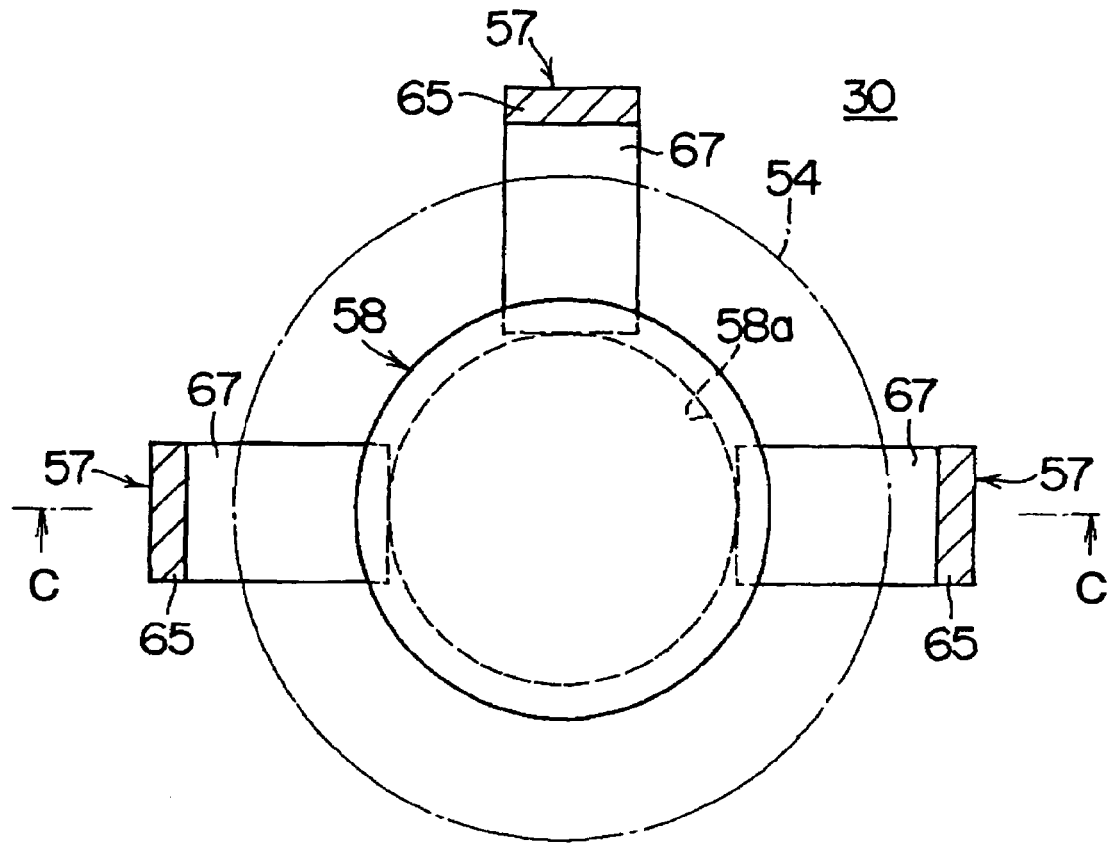
FIG. 9 illustrates a first mode of the supporting portion used in the heat treatment apparatus according to a second embodiment of the present invention, in which (a) is a plan cross-sectional view, and (b) is a cross-sectional view taken along the line C-C.
Figure 9B:
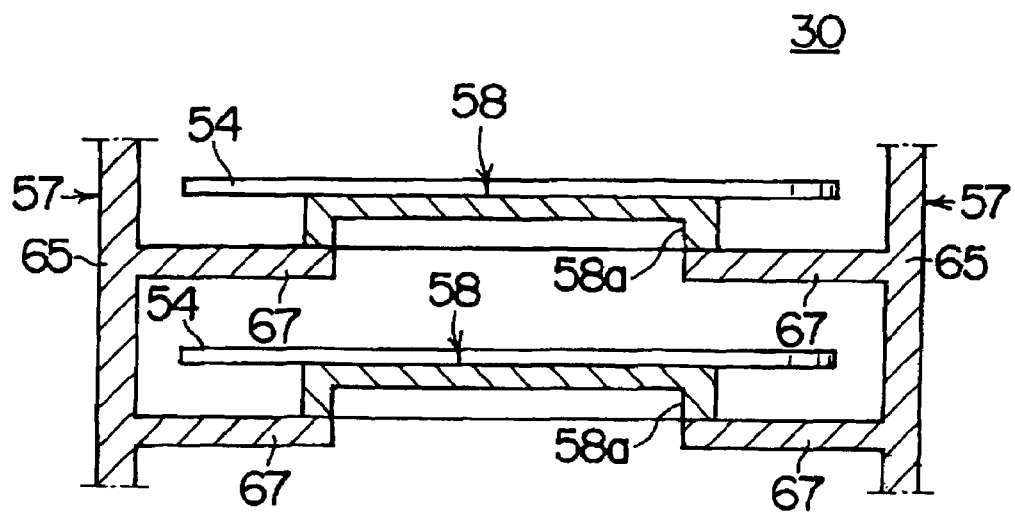

Referring now to FIG. 9, a first mode of the supporting portion 58 provided in the heat treatment apparatus 10 according to the second embodiment will be described.

FIGS. 9(*a*), (*b*) are plan cross-sectional views of a part of the supporting tool 30 in the first mode and a cross-sectional view taken along the line C-C.

As shown in FIG. 9, the back surface (lower surface) of the supporting portion 58 is provided with the spot face (depression) 58*a* concentrically with the supporting portion 58 on a portion inside the distal ends of the supporting strips 67, 67, 67. That is, the inner diameter of the spot face 58*a* is set to be equal to or smaller than the diameter of the circle which is formed by the distal ends of the three supporting strips 67, 67, 67.

The depth of the spot face 58*a* is set to about a half the thickness of the supporting portion 58. The spot face 58*a* is preferably provided in a range which does not overlap the contact surface with respect to the substrate 54 on the supporting portion 58.

The single spot face 58*a* may be provided concentrically with the supporting portion 58 as in this example, or a plurality of the spot faces may also be provided.

With the provision of the spot face 58*a* on the supporting portion 58 in this manner, reduction of the heat capacity of the supporting portion 58 itself may be achieved. Even when the distance between the substrates is relatively small (narrow pitch), the slippage may be restrained, and even when the rate of temperature variation is increased, a state in which the slippage does not occur is achieved.

That is, the number of the substrates to be treated at a time may be increased while achieving the slip-free state. The treatment time may be reduced, and the throughput may be improved.

Figure 10A:
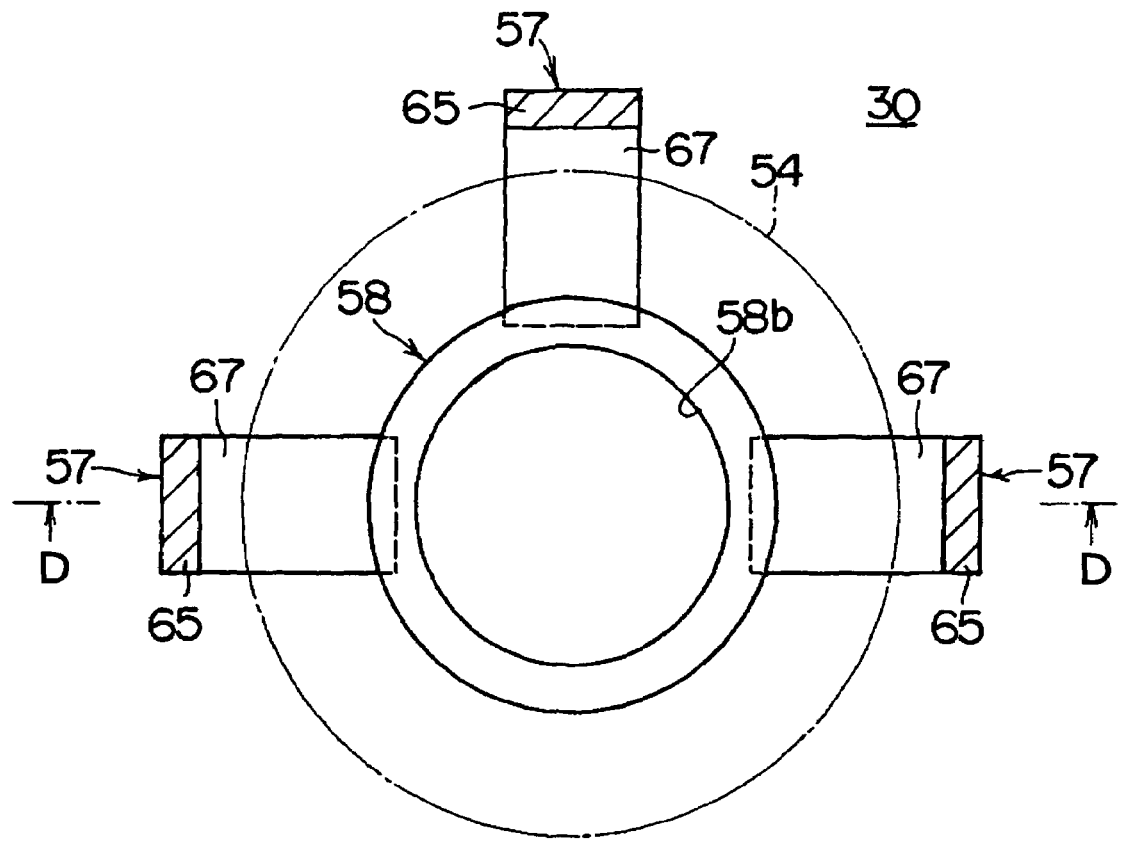
FIG. 10 illustrates a second mode of the supporting portion used in the heat treatment apparatus according to the second embodiment of the present invention, in which (a) is a plan cross-sectional view, and (b) is a cross-sectional view taken along the line D-D.
Figure 10B:
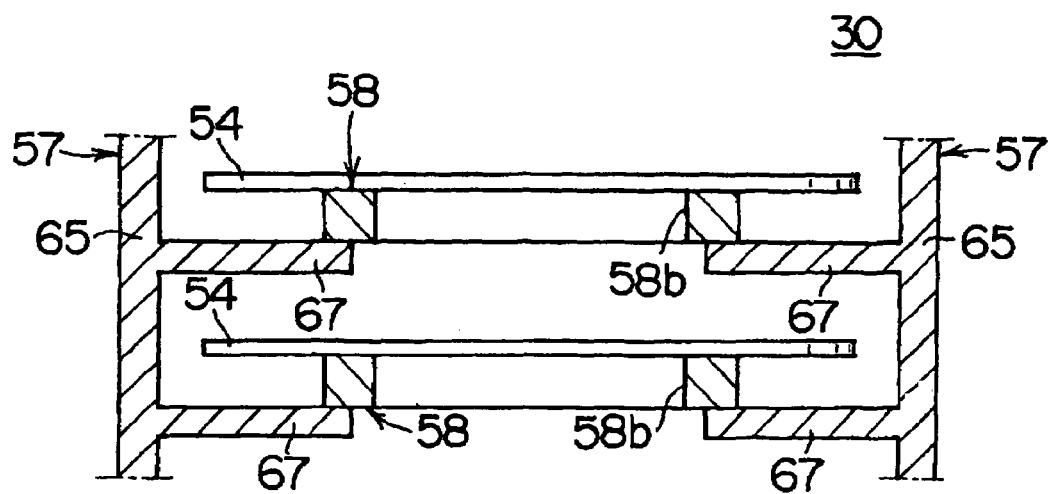
Figure 11A:
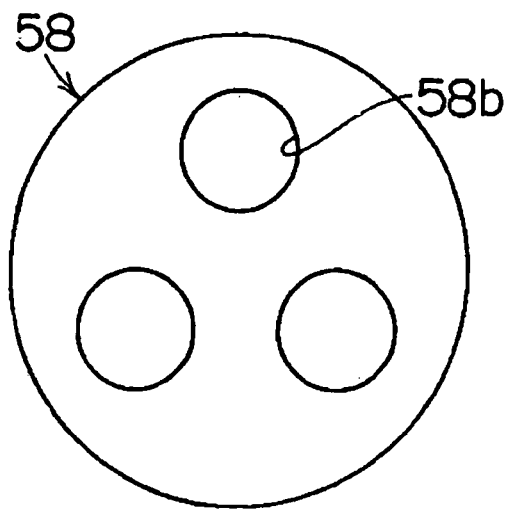
FIG. 11 is a plan view showing a modification of the second mode of the supporting portion used in the heat treatment apparatus according to the second embodiment of the present invention.
Figure 11B:
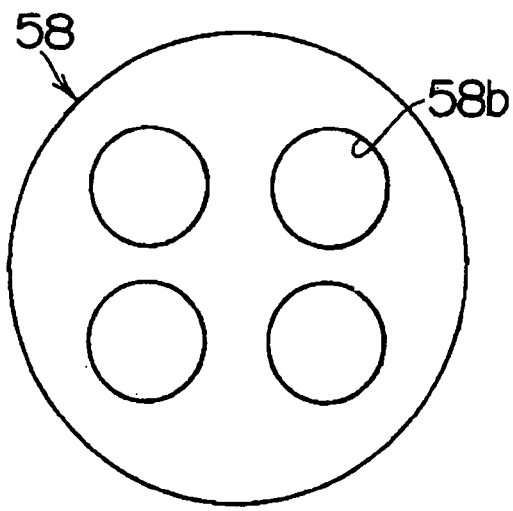
Figure 11C:
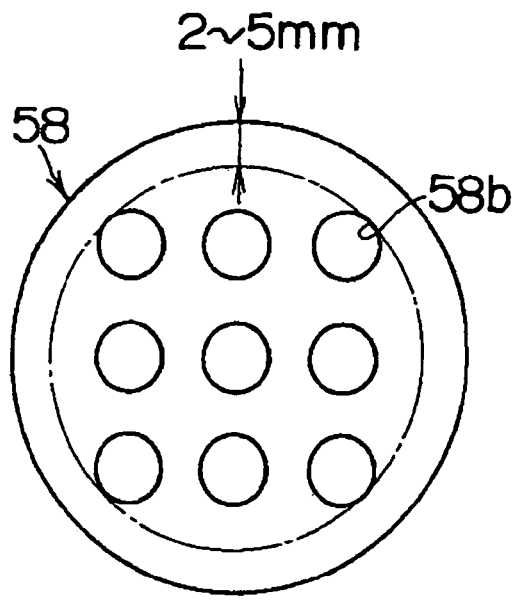
Figure 12A:
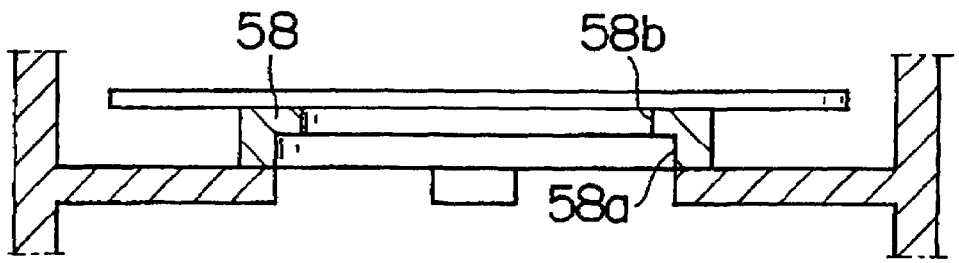
FIG. 12 is a cross-sectional view showing a third mode of the supporting portion used in the heat treatment apparatus according to the second embodiment of the present invention.
Figure 12B:
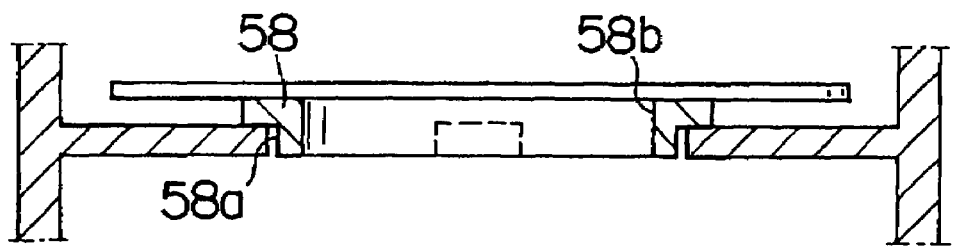
Figure 12C:
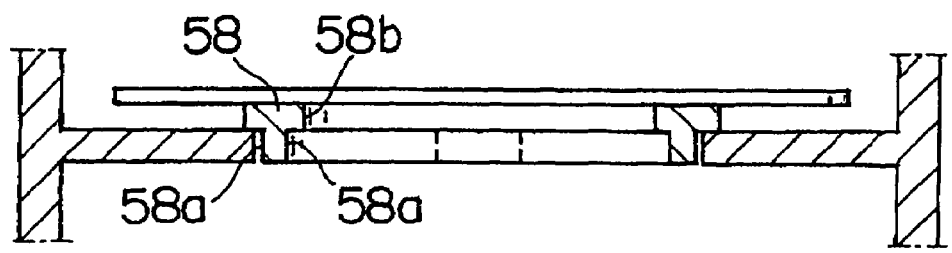
Figure 12D:
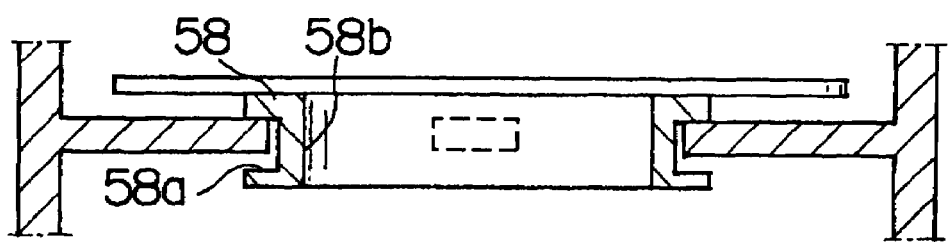
Figure 12E:
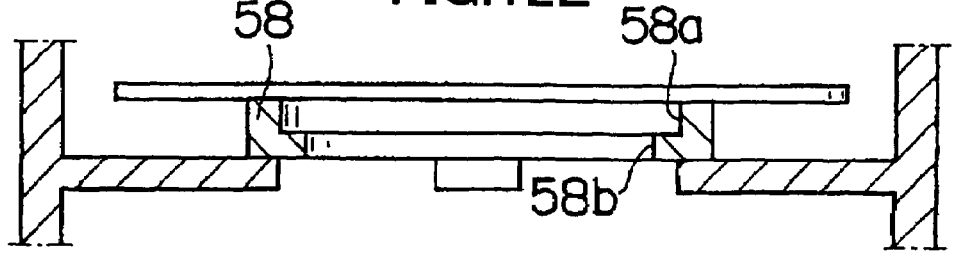

Referring now to FIG. 10 and FIG. 11, a second mode of the supporting portion 58 provided in the heat treatment apparatus 10 according to the second embodiment will be described.

FIGS. 10(*a*), (*b*) are a plan cross-sectional view of a part of the supporting tool 30 in the second mode and a cross-sectional view taken along the line D-D.

FIGS. 11(*a*), (*b*), (*c*) are plan views of modifications of the supporting portion 58 in the second embodiment.

As shown in FIG. 10, the supporting portion 58 is provided with at least one through hole 58*b* concentrically with the supporting portion 58 on a portion inside the distal ends of the supporting strips 67, 67, 67.

The single through hole 58*b* may be provided concentrically with the supporting portion 58 as shown in FIG. 10, or a plurality of the through holes 58*b* may be provided as shown in FIGS. 11(*a*) to (*c*). FIGS. 11(*a*), (*b*), (*c*) show an example in which three through holes 58*b* are provided, an example in which four of those are provided, and an example in which nine of those are provided, respectively.

For ease of machining of the supporting portion 58, the through holes 58*b* as non-contact portions, which do not come into contact with the substrate 54, are preferably arranged on an inner area except for a portion 2 to 5 mm or more from the outer periphery of the supporting portion 58. That is, machining of the supporting portion 58 is facilitated when the through holes 58*b* are arranged inside a circle shown by an imaginary line in FIG. 11(*c*). As described in the first embodiment, when considering the limit of strength of the supporting portion under the temperature variation, it is necessary to arrange the through holes 58*b* on an inner area except for a portion 3 mm or more from the outer periphery of the supporting portion 58.

In this manner, with the provision of the through holes 58*b* on the supporting portion 58, reduction of the heat capacity of the supporting portion 58 itself is achieved, and even when the distance between the substrates is relatively small (narrow pitch), the slippage may be restrained, and even when the rate of temperature variation is increased, a state in which the slippage does not occur is achieved.

That is, the number of the substrates to be treated at a time may be increased while achieving the slip-free state. The treatment time may be reduced, and the throughput may be improved.

Referring now to FIG. 12, a third mode of the supporting portion 58 provided in the heat treatment apparatus 10 according to the second embodiment will be described.

FIGS. 12(*a*), (*b*), (*c*), (*d*), (*e*) are cross-sectional views showing modifications of the supporting portion 58 in the third mode.

FIGS. 12(*a*) to (*e*) show examples using both of the through hole 58*b* and the spot face 58*a* together.

FIG. 12(*a*) shows an example in which the through hole 58*b* is provided at the center of the supporting portion 58 concentrically with the substrate, and the spot face 58*a* is provided on the back surface of the supporting portion 58 in an area except for the peripheral portion.

FIG. 12(*b*) shows an example in which the through hole 58*b* is provided at the center of the supporting portion 58 concentrically with the substrate, and the spot face 58*a* is provided on the back surface of the supporting portion 58 along the outer periphery thereof.

FIG. 12(*c*) shows an example in which the through hole 58*b* is provided at the center of the supporting portion 58 concentrically with the substrate, and the spot face 58*a* is provided on the back surface of the supporting portion 58 both along the outer periphery and at the center thereof.

FIG. 12(*d*) shows an example in which the through hole 58*b* is provided at the center of the supporting portion 58 concentrically with the substrate, and the spot face 58*a* is provided on the side surface of the supporting portion 58.

FIG. 12(*e*) shows an example in which the through hole 58*b* is provided at the center of the supporting portion 58 concentrically with the substrate, and the spot face 58*a* is provided on the upper surface of the supporting portion 58 in an area except for the outer periphery.

In the examples shown in FIGS. 12(a) to (e), the heat capacity of the supporting portion 58 can be reduced while maintaining the strength of the supporting portion 58 since the width (thickness) of the supporting portion 58 in the direction of the height.

A combination of these examples may also be employed.

With the provision of the spot face 58a as well as the through hole 58b on the supporting portion 58 in this manner, reduction of the heat capacity of the supporting portion 58 itself may also be achieved, and even when the distance between the substrates is relatively small (narrow pitch), the slippage may be restrained, and even when the rate of temperature variation is increased, a state in which the slippage does not occur is achieved.

That is, the number of the substrates to be treated at a time may be increased while achieving the slip-free state. The treatment time may be reduced, and the throughput may be improved.

Subsequently, the result of slippage evaluation of the supporting portion 58 in which techniques shown in the first mode and the second mode are employed will be described.

Figure 13:
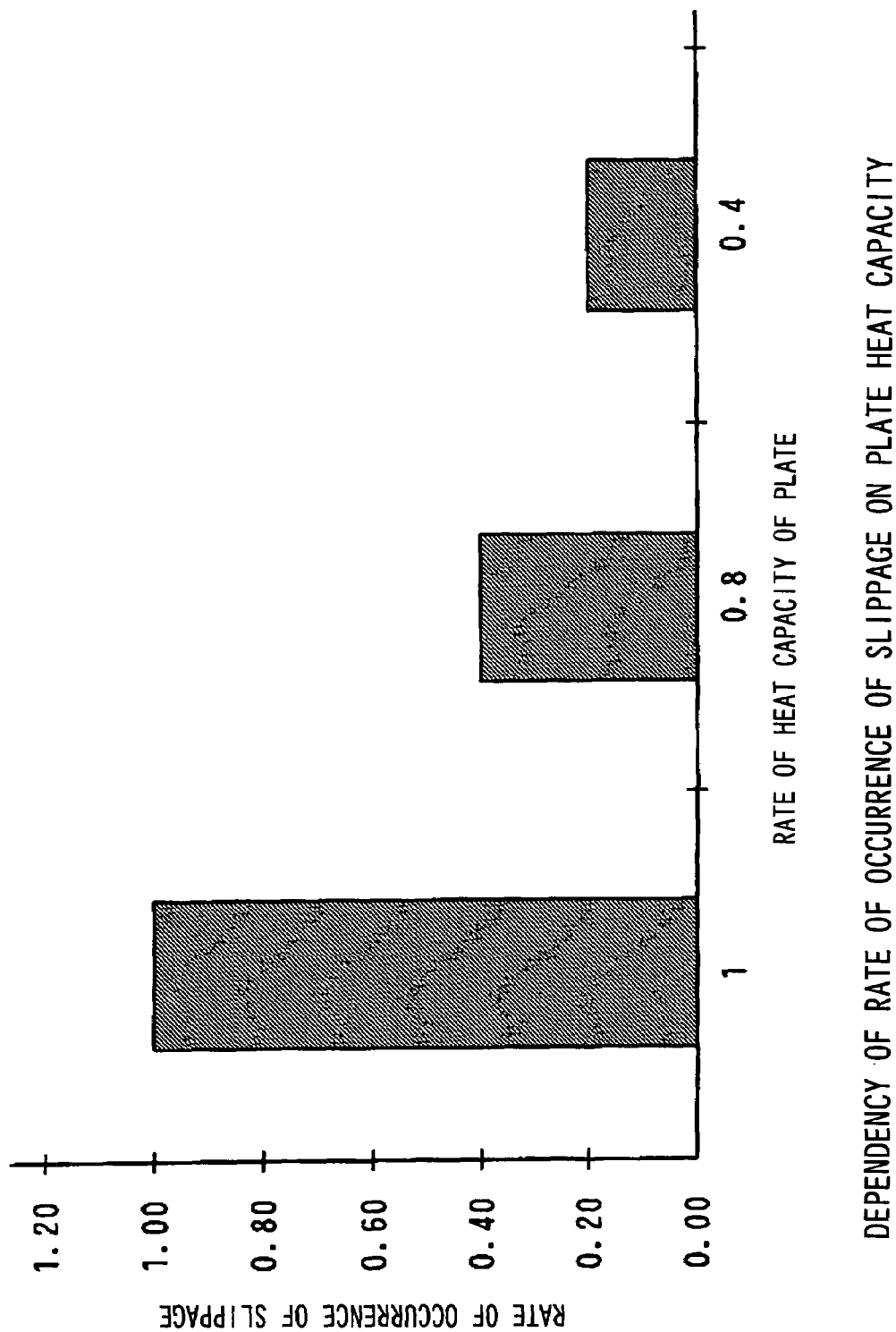
FIG. 13 is a drawing showing a dependency of the rate of occurrence of slippage on the heat capacity of the supporting portion.

FIG. 13 shows an evaluation result of the rate of occurrence of slippage when the substrate 54 is supported by the supporting portion 58 manufactured with the techniques in the first mode and the second mode described above. Since study has made through various heat treatment sequences, the result is shown by rates.

According to the evaluation result of the rate of occurrence of slippage, it is understood that the rate of occurrence of slippage may be reduced by reducing the heat capacity. In addition, the aforementioned first mode and second mode may be understood to be suitable as a technique for reducing the heat capacity.

Subsequently, relations between the value of the heat capacity of the supporting portion (plate member) and the slip-free rate, and between the value of the surface area of the non-contact portion of the supporting portion (plate member) and the slip-free rate, which is a main characteristic of the present invention, will be described.

Firstly, the cause of occurrence of slippage of the wafer in the vertically installed heat treatment apparatus will be studied as a presumption.

Following stresses applied to the wafer is known to be a cause of occurrence of slippage.

(1) A deformation stress caused by deformation (warp) of the wafer due to the self-weight of the supported wafer.

(2) A compression stress caused by the self-weight of the wafer at a support point (contact point) of the supported wafer.

(3) A thermal stress caused by a temperature difference within the surface of the wafer.

In addition to these stresses, the inventors found that the following force may result in occurrence of slippage.

(4) A stress caused by a frictional force and an adhesion force of the wafer at the contact point.

Therefore, in order to prevent occurrence of slippage, it is necessary to reduce the stresses of (1) to (4). That is, it is necessary to inquire into the following wafer supporting methods.

A. A wafer supporting method which causes least deformation on the wafer
B. A wafer supporting method which hardly causes temperature difference within the surface of the wafer
C. A wafer supporting method causing the minimum frictional force and adhesion force at the contact point.

Physical constant values relating the supporting portions shown below seem to relate the causes of occurrence of slippage described in (1) to (4), respectively.
1) Wafer supporting method; (1), (2), (3)
2) Heat capacity of the supporting portion; (3)
3) Contact area between the wafer and the supporting portion; (2), (4)
4) Roughness of the surface (contact portion) of the supporting portion; (4)

[Wafer Supporting Method in 1)]

Figure 15A:
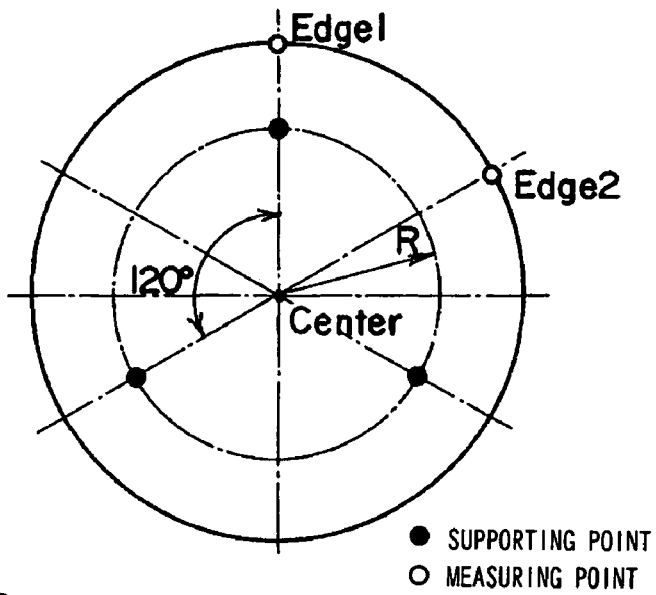
FIG. 15 is an explanatory drawing showing an operation in which the wafer is supported at three points, in which (a) is a pattern plan view, (b) is a graph showing deformation of the wafer, and (c) is a graph showing the maximum main stress at a typical position within the surface of the wafer.
Figure 16A:
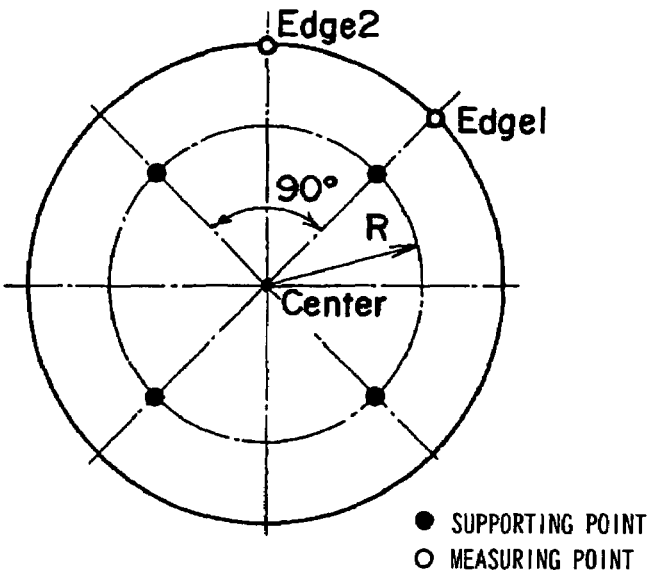
FIG. 16 is an explanatory drawing showing an operation in which a wafer is supported at four points, in which (a) is a pattern plan view, (b) is a graph showing deformation of the wafer, and (c) is a graph showing the maximum main stress at the typical position within the surface of the wafer.

The wafer supporting method in the related art includes, for example, a method in which the wafer is supported at three points (hereinafter, referred to as "three-point support") shown in FIG. 15(a), a method in which the wafer is supported at four points (hereinafter, referred to as "four-point support") shown in FIG. 16(a), and a method in which the wafer is supported by a ring member (hereinafter, referred to as "ring") (hereinafter referred to as "ring support") shown in FIG. 17(a).

Figure 15B:
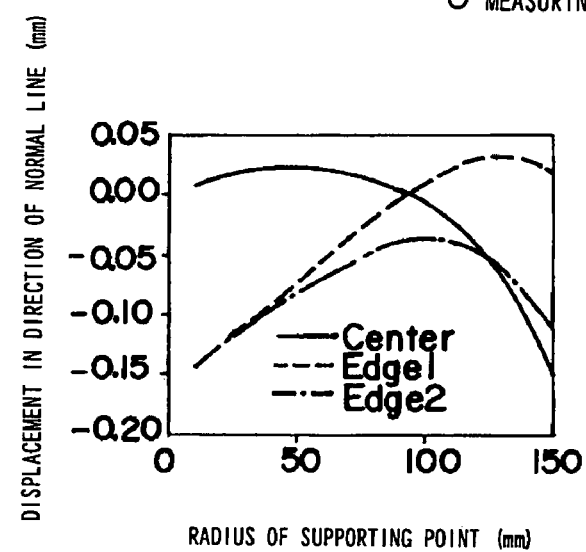
Figure 16B:
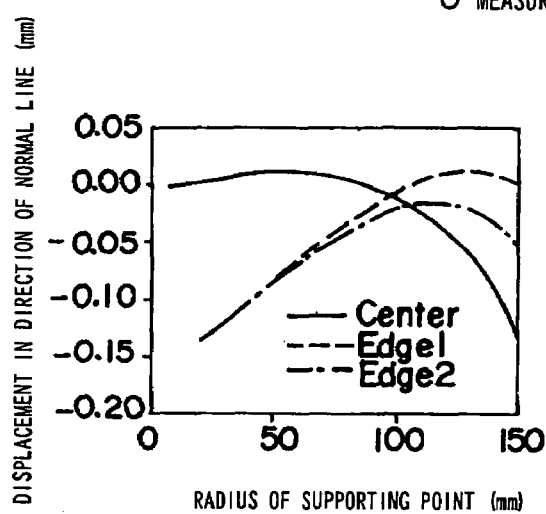
Figure 17A:
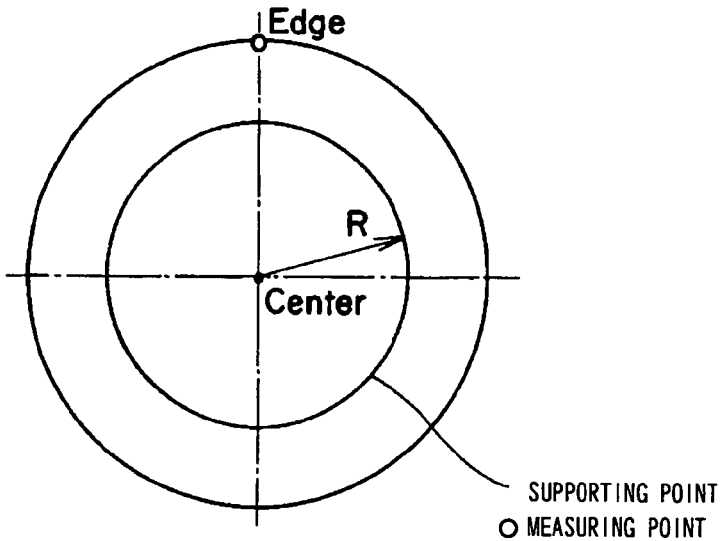
FIG. 17 is an explanatory drawing showing an operation in which the wafer is supported by a plate member, in which (a) is a pattern plan view, (b) is a graph showing deformation of the wafer, and (c) is a graph showing the maximum main stress at the typical position within the surface of the wafer.
Figure 17B:
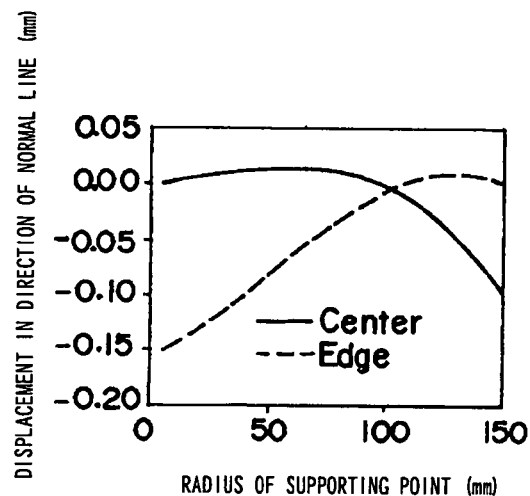

Results of simulation of deformation of the wafer and maximum main stress at a typical position within the surface of the wafer in these wafer supporting methods obtained by calculation are shown in FIGS. 15(b), (c), FIGS. 16(b), (c) and FIGS. 17(b), (c).

According to FIG. 15(b) and FIG. 16(b), in the case of the three-point support and the four-point support, it was found that the amount of deformation between two (a pair of) support points adjacent circumferentially of the wafer is large, and hence the wafer is sagged at this portion.

Figure 15C:
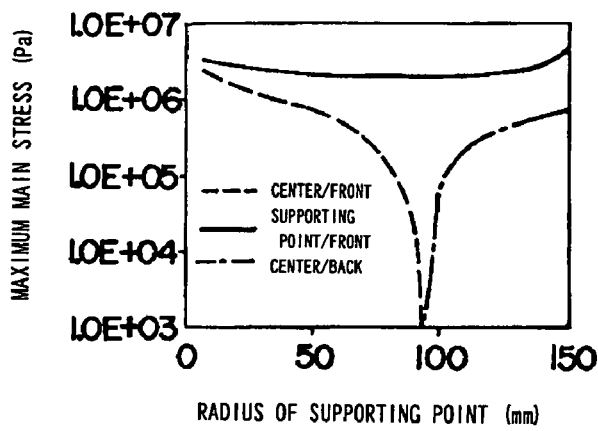
Figure 16C:
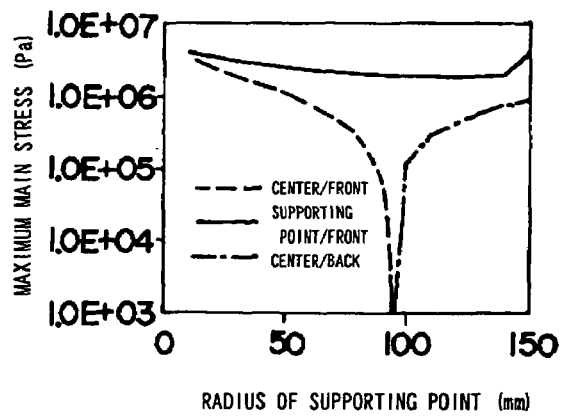

Accordingly, as is clear from FIG. 15(c) and FIG. 16(c), in the case of the three-point support and the four-point support, the maximum main stress on the surface of the wafer at the position of the support point is as high as 1 MPa or higher.

Figure 17C:
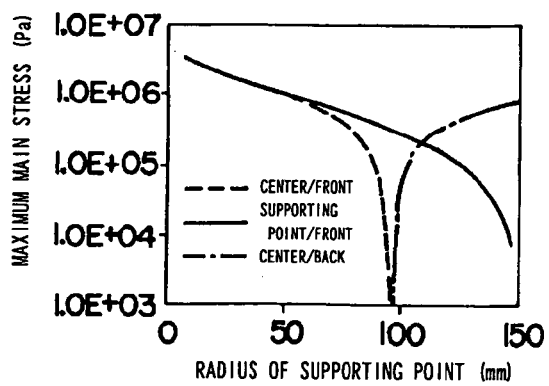

In contrast, in the case of the ring support, since there is no specific supporting point on the circumference of the wafer, the amount of deformation is smaller than the cases of the three-point support and the four-point support and, as shown in FIG. 17(c), the maximum main stress is smaller.

In particular, according to FIG. 17(c), it is understood that the smallest maximum stress at the center of the wafer is obtained when the radius of the support point, that is, the radius R (see FIG. 17(a)) of the outer diameter of the ring is in a range from 95 to 105 mm.

According to the FIG. 17(c), it is also understood that the stress at the support point is smaller than the cases of the three-point support and the four-point support.

From the description shown above, the wafer supporting method using the ring of about 190 to 210 mm in outer diameter is the supporting method which causes the least deformation on the wafer.

Figure 18A:
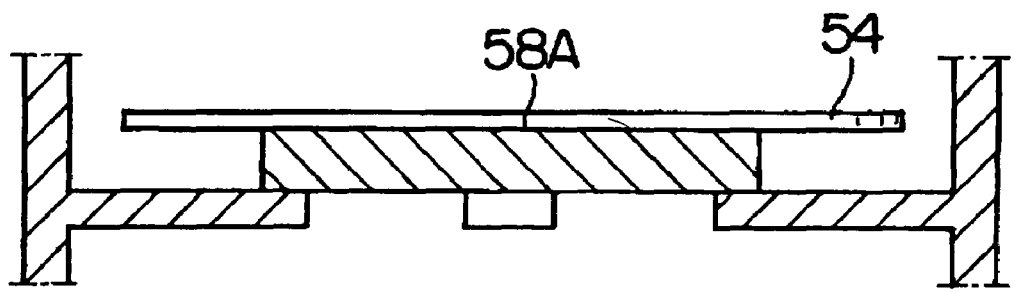
FIG. 18(a) is a front cross-sectional view showing a method of supporting the wafer by the plate member having no thorough hole.

The wafer supporting method shown in FIG. 18(a) in which a plate member (hereinafter, referred to as "plate") 58A of about 190 to 210 mm in outer diameter having no through hole is understood to be a supporting method which causes the least deformation on the wafer like the wafer supporting method with the ring of about 190 to 210 mm in outer diameter.

Figure 18B:
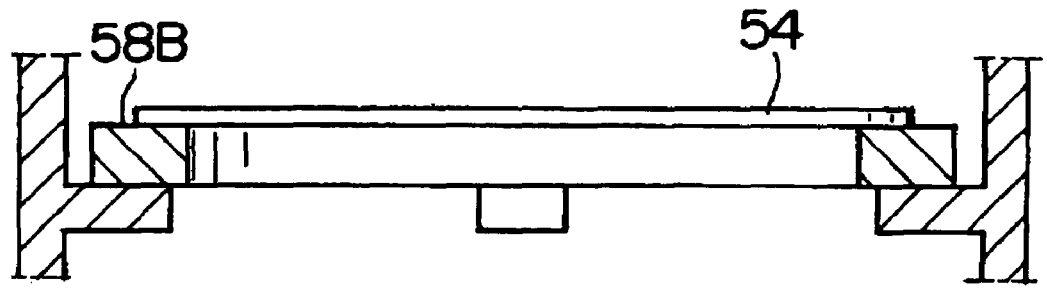
FIG. 18(b) is a front cross-sectional view showing a method of supporting the wafer in which the peripheral portion of the wafer is supported by a ring.

There is a similar wafer supporting method in which the peripheral portion of the wafer 54 is supported by a ring 58B as shown in FIG. 18(b). That is, the outer diameter of the ring 58B in this wafer supporting method is larger than the outer diameter of the wafer 54, and the inner diameter of the ring 58B (the opening diameter of the through hole) is smaller than the outer diameter of the wafer 54.

However, in the case of the wafer supporting method using the ring 58B, the amount of sagging of the wafer 54 at the center is large, and hence the maximum main stress on the back surface (lower surface) of the wafer demonstrates a value further beyond the maximum main stress in the case of the ring support of about 190 to 210 mm in outer diameter shown in FIG. 17. That is, in a view point of deformation of the wafer 54, deformation is completely different between the case in which the wafer is supported by the ring of about 190 to 210 mm in outer diameter and the case in which the peripheral portion of the wafer is supported by the ring.

In a case in which the deformation stress caused by deformation of the wafer due to the self-weight of the wafer (the cause of occurrence of slippage (1)) is a main cause of the slippage, the slippage is considered to occur at a position within the surface of the wafer where the maximum stress is applied.

That is, in the wafer supporting method by the ring of about 190 to 210 mm in outer diameter, the slippage occurs on the surface of the supporting portion, and in the wafer supporting method using the ring 58B that comes into contact with the peripheral portion of the wafer, the slippage occurs not on the surface of the supporting portion, but in the center of the wafer 54. That is, the position where the slippage occurs is completely different between the ring of about 190 to 210 mm in outer diameter and the ring 58B which comes into contact with the peripheral portion of the wafer.

Therefore, the present invention has found the values of the heat capacity and the surface area of the non-contact portion which may clear a predetermined slip-free rate described below on the presumption of the wafer supporting method using the plate member having a smaller outer diameter than the outer diameter of the wafer, specifically the plate member of about 190 to 210 mm in outer diameter, and more specifically, the ring.

[Heat Capacity of the Supporting Portion in 2)]

When there is a temperature difference within the surface of the wafer, it may cause the slippage since a thermal stress caused thereby (the cause of occurrence of slippage (3)) is generated. It can also be supposed from a phenomenon where the slippage may easily be occurred when the rate (rate of temperature increase) of temperature change is increased from the temperature when the wafer is loaded to the temperature where the wafer is treated.

Even though the rate of the temperature change is constant, an object having a large heat capacity cannot be heated up easily, while an object having a small heat capacity can be heated up easily under the temperature increase. Also, the object having the large heat capacity cannot be cooled down easily, while the object having the small heat capacity can be cooled down easily under the temperature decrease.

Therefore, under the temperature increase, when the heat capacity of the plate member (plate and ring) for supporting the wafer is large, the plate member cannot be heated up easily, and hence the closer the distance to the contact position of the wafer supported by the plate member with respect to the plate member is, the longer time it takes to be heated up.

In contrast, under the temperature decrease, when the heat capacity of the plate member (plate and ring) for supporting the wafer is large, the plate member cannot be cooled down easily, and hence the closer the distance to the contact position of the wafer supported by the plate member with respect to the plate member is, the longer time it takes to be cooled down.

In the case of the reactor of the vertically installed batch-type heat treatment apparatus, since the heater is positioned outside the wafer, the peripheral portion of the wafer is brought into a high-temperature area when the temperature in the reactor increases, and the center of the wafer is brought into a high-temperature area when the temperature in the reactor is lowered.

From this face, when the wafer is supported by the ring shown in FIG. 18(b), which comes into contact with the peripheral portion of the wafer, the temperature difference within the surface of the wafer under the temperature increase and decrease may be alleviated by the effect of the heat capacity of the ring.

In contrast, when the wafer is supported by the plate member such the ring or the plate of about 190 to 210 mm in outer diameter, the area from the edge of the wafer to the peripheral portion of the plate member is easily heated up under the temperature increase. However, since it is necessary to heat up the plate member as well for heating up a portion of smaller radius (inner portion), the temperature difference in this portion may easily be larger.

Therefore, when the peripheral portion of the wafer is supported by the ring, discussion about the heat capacity is relatively easy because it has an effect to alleviate the heat impact.

However, in the case in which the wafer is supported by the inner part of the wafer (the inner side of the peripheral portion) as in the case of the plate member according to the present invention, it is necessary to reduce the heat capacity as much as possible.

Therefore, the present inventors had studied experimentally how much the heat capacity of the plate member should be reduced to prevent occurrence of slippage of the wafer in a case in which the wafer is supported by the plate member on the inner side with respect to the outer peripheral portion of the wafer without coming into contact with the outer peripheral portion of the wafer.

Figure 19:
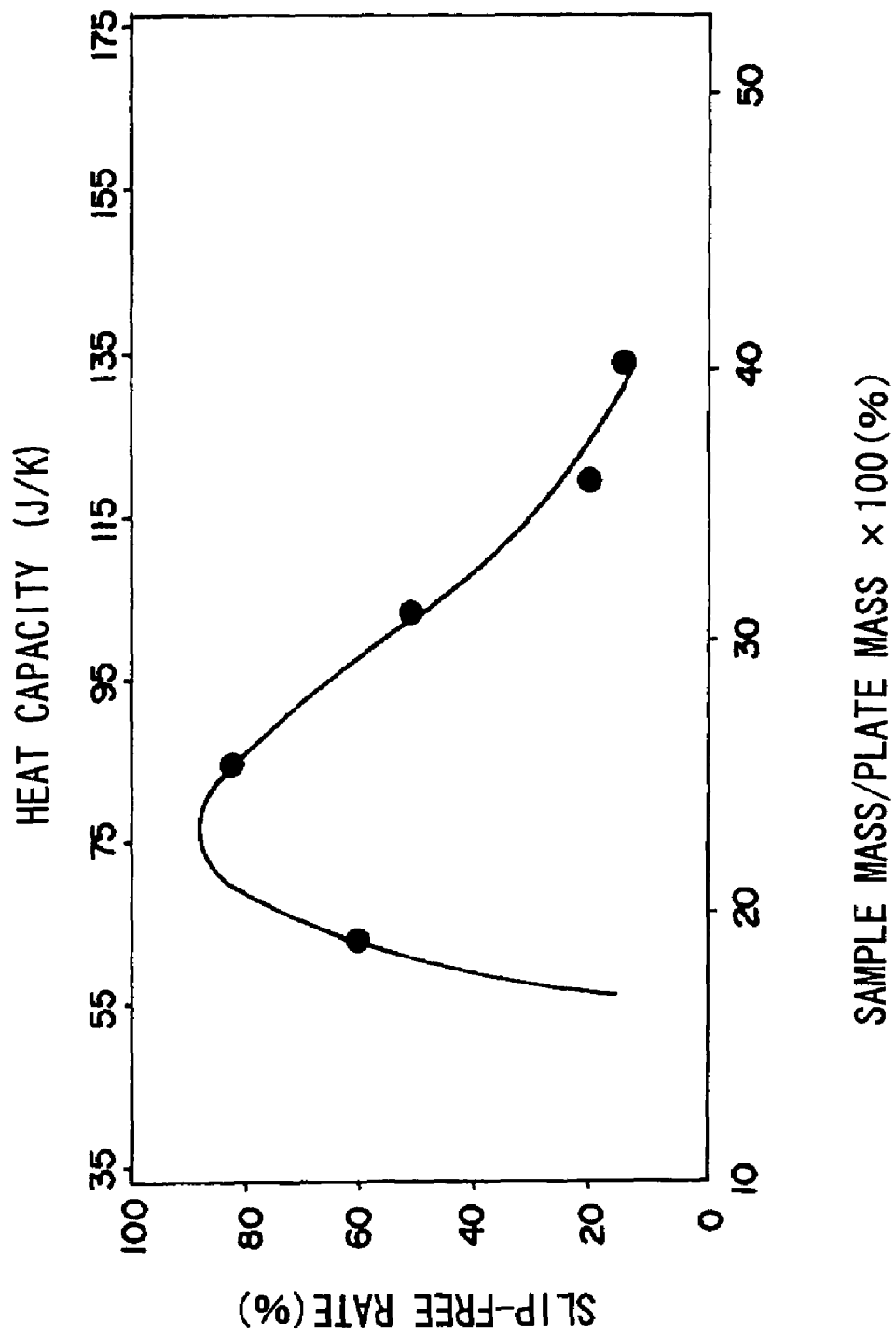
FIG. 19 is a graph sowing the relation among the heat capacity, the mass and the slip-free rate of the plate member.

FIG. 19 shows the result of this experiment.

In the experiment, rings of 6 to 7 mm in thickness and 200 mm in outer diameter (since an R-chamfered portion is provided at an edge on the front side, the outer diameter of the contact portion is 200 mm or smaller), having a through hole at the center as the plate member are used as samples, whose masses, that is, the heat capacities are differentiated by changing the inner diameter of the ring (the diameter of the through hole). That is, a sample having a mass of 40%, a sample having a mass of 32%, a sample having a mass of 31%, a sample having a mass of 26%, and a sample having a mass of 19% with respect to the mass of a plate (100%) having the same thickness and the outer diameter and having no through hole, that is, a ring having an inner diameter of zero are used.

Conditions of the experiment are as follows.

The diameter of the wafer is 300 mm, the pitch of the wafers (distance between the wafers) is 13 to 14 mm, the number of wafers to be treated at a time is 40 to 50 pieces, and the treatment temperature is a temperature equal to or higher than 1300° C., that is, a range from 1300 to 1400° C.

The samples are installed simultaneously in an experimental reactor at areas having a uniform temperature in the reactor.

In FIG. 19, the lower lateral axis represents the percent of the mass of the sample with respect to the mass of the plate member (plate) having no through hole, and the upper lateral axis represents the heat capacity corresponding to the lower lateral axis.

The vertical axis represents the slip-free rate. The slip-free rate corresponds to a percent obtained by dividing the number of wafers from which the slippage was not observed by the total number of treated wafers.

According to the result shown in FIG. 19, it is proved that when the heat capacity of the ring is 100 J/K (which is the rate of the mass of the ring with respect to the plate, that is, 32%) or smaller, a slip-free rate of 40% is obtained.

That is, it is determined that the slippage which is caused by the thermal stress due to the temperature difference within the surface of the wafer (the cause of occurrence of slippage (3)) have a small influence when the heat capacity of the ring (plate member) is 100 J/K or smaller.

In FIG. 19, when the heat capacity of the ring is further reduced, the slip-free rate is reduced after having reached an extremely large value. It seems to be because of the effect of the contact area of the plate member described below.

According to the result shown in FIG. 19, the following points are proved.

When the heat capacity of the ring is included in a range between 61 J/K and 103 J/K inclusive (the rate of the mass of the ring with respect to that of the plate is included in a range between 18% and 31% inclusive), a slip-free rate of 50% or higher is obtained.

When the heat capacity of the ring is included in a range between 63 J/K and 96 J/K inclusive (the rate of the mass of the ring with respect to that of the plate is included in a range between 19% and 29% inclusive), a slip-free rate of 60% or higher is obtained.

When the heat capacity of the ring is included in a range between 66 J/K and 91 J/K inclusive (the rate of the mass of the ring with respect to that of the plate is included in a range between 20% and 28% inclusive), a slip-free rate of 70% or higher is obtained.

When the heat capacity of the ring is included in a range between 70 J/K and 84 J/K inclusive (the rate of the mass of the ring with respect to that of the plate is included in a range between 21% and 26% inclusive), a slip-free rate of 80% or higher is obtained.

The slip-free rate is practically required to be at least 50% or higher, and the lower rate is not practically preferable.

When an experiment of applying heat treatment on the wafer was conducted for the three-point support and the four-point support described before under the similar conditions as in the experiment describe above, that is, the diameter of the wafer is 300 mm, the pitch of the wafers is 13 to 14 mm, the number of wafers to be treated at a time is 40 to 50 pieces, and the treatment temperature is a temperature of a range from 1300 to 1400° C., there is no case where no wafer is subjected to the slippage, and hence the slip-free rate was 0%.

[Contact Area Between the Wafer and the Supporting Portion in 3), and Roughness of the Surface of the Supporting Portion in 4)]

As described before, when the wafer and the plate member are relatively deformed (thermal expansion or the like) in the direction parallel to the supporting surface due to the difference in rate of thermal expansion, the difference in temperature or the like, a shearing stress is generated at the adhered portion, which may cause the slippage. The reason is briefly described here.

As a general view of friction, a superficial contact area is different from an actual contact area. The actual contact area is constant irrespective of the superficial contact area as long as the load and the physical property are the same. From these reasons, the smaller the superficial contact area is, the more the amount of clutching at a minute projection on the wafer or the supporting portion that supports the wafer increases.

This may cause increase in the compression stress caused by the self-weight of the wafer at the support point (contact point) of the supported wafer (the cause of occurrence of slippage (2)), and change in the frictional force and the adhesive force at the contact point (the cause of occurrence of slippage (4)).

The inventors inquired experimentally into the relation between the superficial contact area between the wafer and the plate member and the slip-free rate described thus far.

Figure 20:
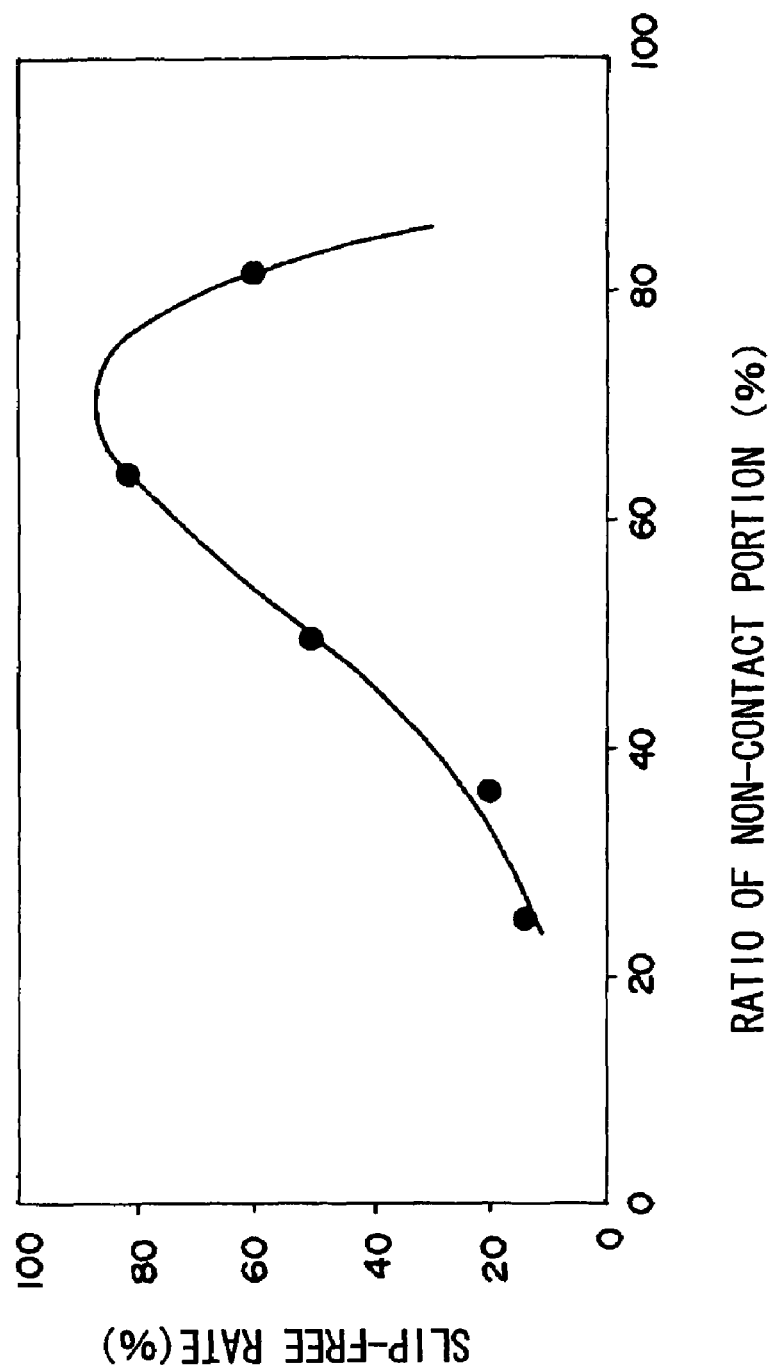
FIG. 20 is a graph showing the relation between the superficial contact area between the wafer and the plate member and the slip-free rate.

FIG. 20 shows the result of this experiment.

In the experiment, rings of 6 to 7 mm in thickness and 200 mm in outer diameter (since an R-chamfered portion is provided at an edge on the front side, the outer diameter of the contact portion is 200 mm or smaller) having a through hole at the center as the plate member are used as samples, whose surface area of the non-contact portion with respect to the wafer in the wafer placing plane of the ring are differentiated by changing the inner diameter of the ring (the diameter of the through hole). That is, a sample having a surface area of the non-contact portion of 25%, a sample having a surface area of the non-contact portion of 35%, a sample having a surface area of the non-contact portion of 50%, a sample having a surface area of the non-contact portion of 65%, and a sample having a surface area of the non-contact portion of 80% with respect to the surface area of the wafer placing plane of the plate member (plate) (0%) having the same thickness and the outer diameter and having no through hole are used.

Conditions of the experiment are as follows.

The diameter of the wafer is 300 mm, the pitch of the wafers (distance between the wafers) is 13 to 14 mm, the number of wafers to be treated at a time is 40 to 50 pieces, and the treatment temperature is in a range from 1300 to 1400° C.

The samples are installed simultaneously in an experimental reactor at areas having a uniform temperature in the reactor.

In FIG. 20, the lateral axis represents the rate of non-contact portion (the rate of surface area of the non-contact portion to the wafer in the wafer placing plane of the sample with respect to the surface area of the wafer placing plane of the plate) in percentage.

The vertical axis represents the slip-free rate of each sample.

According to the result shown in FIG. 20, it is proved that the slip-free rate increases with increase in rate of non-contact portion, and decreases after having increased to a certain extent.

According to FIG. 20, the following points are proved.

When the rate of non-contact portion is set to a range between 50% and 83% inclusive, the slip-free rate of 50% or higher is achieved.

When the rate of non-contact portion is set to a range between 55% and 80% inclusive, the slip-free rate of 60% or higher is achieved.

When the rate of non-contact portion is set to a range between 58% and 78% inclusive, the slip-free rate of 70% or higher is achieved.

When the rate of non-contact portion is set to a range between 64% and 75% inclusive, the slip-free rate of 80% or higher is achieved.

As described above, the slip-free rate is practically required to be at least 50% or higher, and the lower rate is not practically preferable.

The range of the rate of non-contact portion for preventing the slippage of the substrate in the first embodiment was in the range between 25% and 94% inclusive. That is, the range of the rate of non-contact portion for achieving the practically required slip-free rate is included in the range of the rate of non-contact portion for preventing slippage of the substrate. That is, it was found that not only the practically required slip-free rate is achieved, but also the slippage of the substrate when placing the substrate automatically on the supporting portion is prevented by setting the rate of non-contact portion to the range between the 50% and 83% inclusive, so that the different problems are solved simultaneously.

The reason why the slip-free rate is improved in association with increase in the rate of non-contact portion of the plate member will be described below in conjunction with FIG. 21.

Figure 21A:
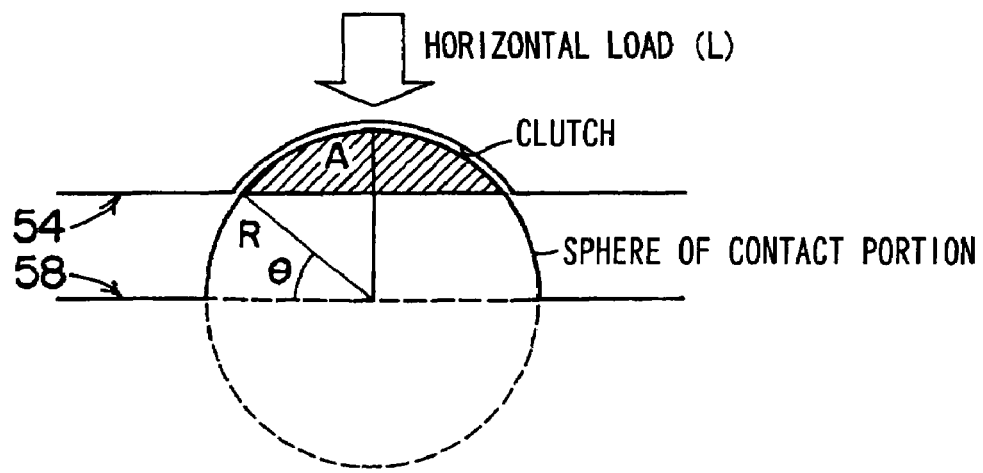
FIG. 21 is an explanatory drawing showing the reason why the slip-free rate increases in association with increase in the rate of non-contact portion on the plate member, in which (a) is a pattern diagram, and (b) is a graph.
Figure 21B:
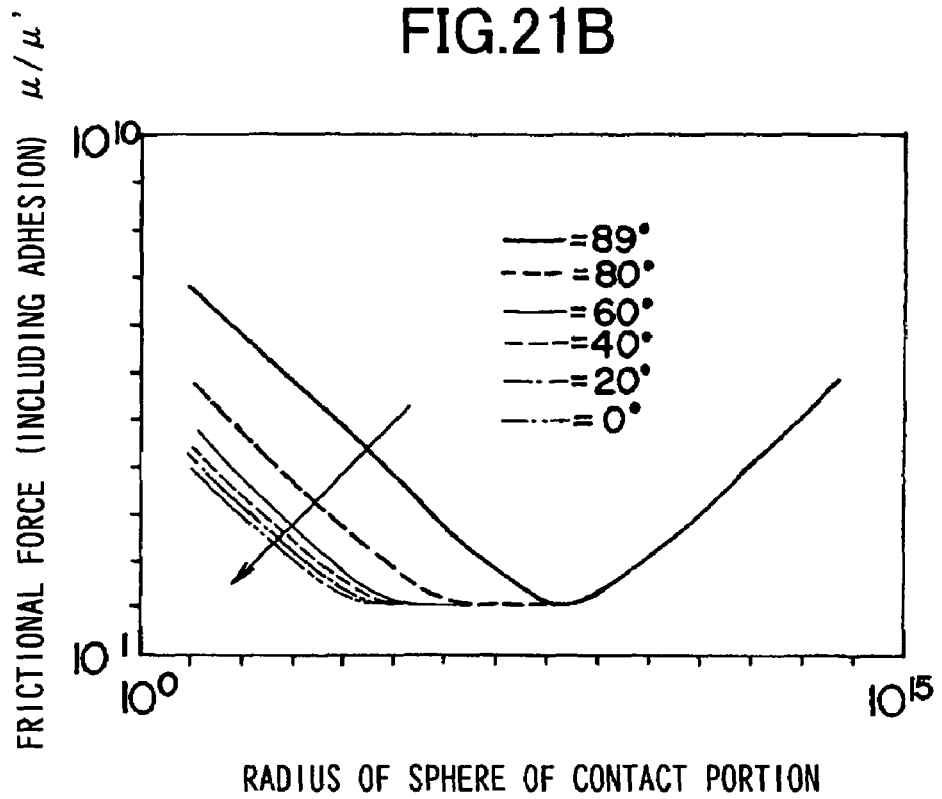

The range in which the frictional force (including the adhesive force) at the contact point between the wafer and the plate member shown in the vertical axis in FIG. 21(b) becomes the minimum value depends on the radius R of a contact point sphere shown in FIG. 21(a), and hence when a narrow angle θ shown in FIG. 21(a) is decreased, the range in which the frictional force becomes the minimum value increases.

That is, when the actual surface roughness Ra of the plate member is constant, the number of minute points that support the wafer decreases as the superficial contact area decreases, and hence the amount of clutching increases from the concept that the actual contact area is constant.

That is, the narrow angle θ in FIG. 21 decreases, and at last, possibility that the surface roughness Ra of the plate member falls within an optimal range, that is, the range in which the frictional force becomes the minimum is increased.

It is already proved that the range where the frictional force of the surface roughness Ra becomes the minimum value in the case where the wafer is supported by the plate member according to the present invention is from 1 μm to 1000 μm.

On the other hand, as the rate of non-contact portion of the plate member increases, the amount of clutching is further increased. In this case, it is supposed that the slip-free rate decreases because the compression stress caused by the self-weight of the wafer at the support point (contact point) (the cause of occurrence of slippage (2)) increases.

The present invention is not limited to the above-described embodiments, and various modifications may be made without departing the scope of the invention as a matter of course.

For example, in the description of the respective embodiments shown above, the batch-type heat treatment apparatus in which a plurality of the substrates are heat-treated is employed. However, the invention is not limited thereto, and a sheet-fed type may also be applicable.

The heat treatment apparatus in the present invention may be applied to a method of manufacturing substrates as well.

An example in which the heat treatment apparatus in the present invention is applied to one process in a method of manufacturing SIMOX (Separation by Implanted Oxygen) wafer which is a kind of SOI (Silicon On Insulator) wafers will be described.

Firstly, oxygen ion is injected into a monocrystal silicon wafer by an ion injection apparatus or the like.

Then, the wafer in which the oxygen ion is injected is annealed at a high temperature between 1300° C. and 1400° C. inclusive, for example, at a temperature of 1350° C. or higher under the atmosphere of, for example, Ar, $O_2$ using the heat treatment apparatus in the above-described embodiments.

With these procedures, a SIMOX wafer having a $SiO_2$ layer formed in the interior of the wafer (in which the $SiO_2$ layer is embedded) is manufactured.

It is also possible to apply the heat treatment apparatus in the present invention to a process in a method of manufacturing hydrogen annealed wafers or Ar annealed wafers in addition to the SIMOX wafers.

In this case, wafers are annealed at a temperature about 1200° C. or higher in the hydrogen atmosphere or the Ar atmosphere using the heat treatment apparatus in the present invention. Accordingly, defects of crystal on the surface layer of the wafer on which the IC (integrated circuit) is formed may be reduced, and hence perfectibility of crystal may be improved.

In addition, it is also possible to apply the heat treatment apparatus in the present invention to a process in a method of manufacturing epitaxial wafers.

Even when a high-temperature annealing treatment is performed as a process in the methods of manufacturing substrates, the slippage which occurs when the substrate is supported on the supporting portion formed of the plate member may be positively prevented and, in addition, the slip-free rate may be improved by using the heat treatment apparatus in the present invention.

The heat treatment apparatus in the present invention may be applied to a method of manufacturing or a step of manufacturing semiconductor devices.

In particular, it is preferable to apply the heat treatment apparatus to a heat treatment process performed at a relatively high temperature, for example, heat oxidizing processes such as wet oxidation, dry oxidation, hydrogen burning oxidation (pyrogenic oxidation), or HCl oxidation, or heat diffusing process for diffusing impurities (dopant) such as boron (B), phosphorus (P), arsenic (As), or antimony (Sb) to a semiconductor thin film.

In the case in which the heat treatment process as one process of the manufacturing process for such semiconductor device as well, the slippage which occurs when the substrate is supported on the supporting portion formed of the plate member may be positively prevented and, in addition, the slip-free rate may be improved by using the heat treatment apparatus in the present invention.

The respective embodiments and the modifications of the respective embodiments described above may be combined for use.

INDUSTRIAL APPLICABILITY

The present invention may be used in a method of manufacturing substrates in which the substrates are heat-treated in a state of being supported by the supporting tool in a case in which positive prevention of the slippage which occurs when the substrates are supported on the supporting portions formed of plate members is required.

The invention claimed is:

1. A heat treatment apparatus comprising:
a reaction container for treating a substrate;
a supporting tool for supporting the substrate in the reaction container; and
a substrate transfer unit configured to transfer the substrate to the supporting tool,
wherein the substrate transfer unit includes an arm portion that is adapted to support a peripheral portion of the substrate,
the supporting tool includes a supporting portion which comes into contact with the substrate and a body portion for supporting the supporting portion, the supporting portion is formed of a plate member for supporting the substrate so as not to come into contact with the peripheral portion of the substrate and includes a non-contact portion at a center of a substrate placing plane of the plate member so as to communicate with an outside without being in contact with the substrate, and the surface area of the non-contact portion is set to a range between 25% and 94% inclusive of a surface area of an area surrounded by an outer edge line of the substrate placing plane of the plate member, and the substrate transfer unit transfers the substrate to the supporting tool at a velocity of 1 to 5 millimeters per second.

2. The heat treatment apparatus according to claim 1, wherein the surface area of the non-contact portion is set to a range between 25% and 90% inclusive of the surface area of the area surrounded by the outer edge line of the substrate placing plane of the plate member.

3. The heat treatment apparatus according to claim 1, wherein the supporting portion is of a disc shape having a diameter from 190 to 210 mm, and the diameter of the substrate is 300 mm.

4. The heat treatment apparatus according to claim 1, wherein the supporting tool is adapted to support a plurality of the substrates in a plurality of stages substantially horizontally while leaving spaces therebetween.

5. The heat treatment apparatus according to claim 1, wherein the body portion is made of SiC, the supporting portion is made of Si or SiC, and the supporting portion is formed with a layer of $SiO_2$, SiC or $Si_3N_4$ on a surface thereof.

6. The heat treatment apparatus according to claim 1, wherein the substrate transfer unit is configured to transfer the substrate to the supporting tool at a velocity of 3 to 4 millimeters per second.

7. A method of manufacturing a substrate comprising the step of:

transferring a substrate onto a supporting portion by a substrate transfer unit at a velocity of 1 to 5 millimeters per second, the supporting portion being formed of a plate member for supporting the substrate so as not to come into contact with a peripheral portion of the substrate and including a non-contact portion at a center of a substrate placing plane of the plate member so as to communicate with an outside without being in contact with the substrate, a surface area of the non-contact portion is set to a range between 25% and 94% inclusive of a surface area of an area surrounded by an outer edge line of the substrate placing plane of the plate member, the substrate transfer unit being adapted to support the peripheral portion of the substrate, loading the substrate supported by the supporting portion into a reaction container, heat treating the substrate supported by the supporting portion in the reaction container, and unloading the substrate supported by the supporting portion from the reaction container after heat treatment.

8. A heat treatment apparatus comprising:

a reaction container for treating a substrate;

a supporting tool for supporting the substrate in the reaction container, the supporting tool being adapted to support a plurality of substrates in a plurality of stages horizontally while leaving spaces therebetween; and a substrate transfer unit configured to transfer the substrate to the supporting tool;

wherein the supporting tool includes a plurality of supporting portions which come into contact with the plurality of the substrates and a body portion for supporting the plurality of supporting portions, each of the plurality of supporting portions being formed of a plate member for supporting the substrate so as not to come into contact with a peripheral portion of the substrate and including a non-contact portion within a substrate placing plane of the plate member so as to communicate with an outside without being in contact with the substrate, wherein a surface area of the non-contact portion is set to a range between 25% and 94% inclusive of a surface area of an area surrounded by an outer edge line of the substrate placing plane of the plate member, the substrate transfer unit including arm portions, the arm portions being adapted to support the peripheral portion of the substrate, the substrate transfer unit being configured to transfer the substrate to the supporting tool at a velocity of 1 to 5 millimeters per second and to transfer a plurality of the substrates at the same time.

* * * * *